US008581574B2

(12) United States Patent
Eken et al.

(10) Patent No.: US 8,581,574 B2
(45) Date of Patent: Nov. 12, 2013

(54) LOGARITHMIC MEAN-SQUARE POWER DETECTOR

(75) Inventors: Yalcin A. Eken, Istanbul (TR); Peter J. Katzin, Arlington, MA (US)

(73) Assignee: Hittite Microwave Corporation, Chelmsford, MA (US)

( * ) Notice: Subject to any disclaimer, the term of this patent is extended or adjusted under 35 U.S.C. 154(b) by 494 days.

(21) Appl. No.: 12/951,654

(22) Filed: Nov. 22, 2010

(65) Prior Publication Data

US 2011/0193550 A1    Aug. 11, 2011

Related U.S. Application Data

(60) Provisional application No. 61/263,668, filed on Nov. 23, 2009, provisional application No. 61/383,814, filed on Sep. 17, 2010.

(51) Int. Cl.
*G01R 19/00* (2006.01)
(52) U.S. Cl.
USPC ..................................... 324/140 R
(58) Field of Classification Search
USPC .............. 324/117 H, 117 R, 126, 127, 140 R; 257/48; 438/14–18; 327/348, 351; 330/140, 254
See application file for complete search history.

(56) References Cited

U.S. PATENT DOCUMENTS

| | | | |
|---|---|---|---|
| 3,517,216 A | 6/1970 | Cope | |
| 3,992,584 A | 11/1976 | Dugan | |
| 4,047,235 A | 9/1977 | Davis | |
| 4,156,848 A | 5/1979 | Stimple et al. | |
| 4,758,793 A | 7/1988 | Sheade et al. | |
| 4,873,484 A | 10/1989 | Adam | |
| 4,990,803 A | 2/1991 | Gilbert | |
| 5,077,541 A | 12/1991 | Gilbert | |
| 5,126,686 A | 6/1992 | Tam | |
| 5,268,601 A | 12/1993 | Cossins | |
| 5,274,582 A | 12/1993 | Whitby | |
| 5,298,811 A | 3/1994 | Gilbert | |
| 5,338,985 A | 8/1994 | Fotowat-Ahmady et al. | |
| 5,402,451 A | 3/1995 | Kaewell, Jr. et al. | |
| 5,432,478 A | 7/1995 | Gilbert | |

(Continued)

OTHER PUBLICATIONS

International Search Report and Written Opinion for PCT/US2010/057611 dated Jul. 27, 2011.

(Continued)

*Primary Examiner* — Tung X Nguyen
(74) *Attorney, Agent, or Firm* — Rajesh Vallabh; Foley Hoag LLP

(57) ABSTRACT

A mean square power detector in accordance with one or more embodiments includes a gain or attenuation circuit comprising a plurality of gain or attenuation elements arranged for generating a plurality of amplified or attenuated versions of a radio frequency (RF) input signal. The mean square power detector also includes a plurality of mean square detectors coupled to the gain or attenuation circuit. Each of the mean square detectors receives a different one of the plurality of amplified or attenuated versions of the RF input signal. Each of the plurality of mean square detectors generates an output signal representative of the mean square power of the RF input signal for a different input signal level range. A summing element is coupled to the plurality of mean square detectors for combining the output signals of the plurality of mean square detectors to generate a signal representative of the mean square or root mean square of the RF input signal.

42 Claims, 27 Drawing Sheets

(56) References Cited

U.S. PATENT DOCUMENTS

| | | | |
|---|---|---|---|
| 5,450,029 A | * | 9/1995 | Jacobs et al. ............... 327/348 |
| 5,473,244 A | | 12/1995 | Libove et al. |
| 5,608,409 A | | 3/1997 | Rilling |
| 5,684,431 A | * | 11/1997 | Gilbert et al. ............... 330/254 |
| 5,724,003 A | | 3/1998 | Jensen et al. |
| 5,790,943 A | | 8/1998 | Fotowat-Ahmady et al. |
| 6,098,463 A | | 8/2000 | Goldberg |
| 6,291,984 B1 | | 9/2001 | Wong et al. |
| 6,437,630 B1 | | 8/2002 | Gilbert |
| 2002/0024357 A1 | | 2/2002 | Ratni et al. |
| 2005/0195029 A1 | | 9/2005 | Cristaudo et al. |
| 2008/0297256 A1 | | 12/2008 | Eken et al. |

OTHER PUBLICATIONS

Counts, et al., "Second-Generation Monolithic RMS-To-DC Converter," Analog Dialogue, vol. 18, No. 1, pg. 11-13 (1984).

Counts, et al., "Monolithic IC RMS-To-DC Converter," Analog Dialogue, vol. 11, No. 2, pp. 3 and 4 (1977).

Counts, "True RMS Measurement Using the AD531," Analog Dialogue, vol. 7, No. 1, p. 13 (1972).

Gilbert, "Current-Mode Circuits from a Translinear Viewpoint: A Tutorial," in. C. Toumazou, F. J. Lidgey, and D. G. Haigh, eds., Analogue IC Design: The. Current-Mode Approach, London: Peter Peregrinus, pp. 11-91, 1990.

Gilbert, "Translinear Circuits: An Historical Overview," Analog Integrated Circuits and Signal Processing, vol. 9, No. 2, pp. 95-118 (1996).

Kitchin, et al., "Low-Cost True-MRS Chips Also Compute AC Average," Analog Dialogue, vol. 22, No. 1, pp. 8 and 9 (1988).

Nash, et al., "Revolutionary RFIC Performs RMS-to-DC Conversion," Microwaves & RF, pp. 140-146 (Sep. 1999).

* cited by examiner

LOGARITHMIC MEAN-SQUARE POWER DETECTOR

CROSS REFERENCE TO RELATED APPLICATIONS

This application claims priority from (1) U.S. Provisional Patent Application Ser. No. 61/263,668, filed on Nov. 23, 2009, entitled Logarithmic Mean-Square Power Detector, and (2) U.S. Provisional Patent Application Ser. No. 61/383,814, filed on Sep. 17, 2010, entitled Multiple Stage Squaring Detector, both of which are hereby incorporated by reference.

BACKGROUND

There are many applications in which it is desirable to measure the average power level of a radio frequency (RF) signal. For example, power measurement and control of RF signals in both the transmitting and receiving chains of modern wireless communications systems, such as cellular telephone networks, may be essential. To efficiently use the available bandwidth, the transmitted signals in these systems may be modulated using complex modulation schemes such as Code Division Multiple Access (CDMA), Wideband Code Division Multiple Access (WCDMA), or Worldwide Interoperability for Microwave Access (WiMAX). These complex modulated signals have a time varying crest factor, which is defined as the peak to average power ratio of the signal. Intolerable errors can result if conventional power detectors are used to measure the signal power of the modulated signals.

BRIEF SUMMARY OF DISCLOSURE

A mean square power detector in accordance with one or more embodiments includes a gain or attenuation circuit comprising a plurality of gain or attenuation elements arranged for generating a plurality of amplified or attenuated versions of a radio frequency (RF) input signal. The mean square power detector also includes a plurality of mean square detectors coupled to the gain or attenuation circuit. Each of the mean square detectors receives a different one of the plurality of amplified or attenuated versions of the RF input signal. Each of the plurality of mean square detectors generates an output signal representative of the mean square power of the RF input signal for a different input signal level range. A summing element is coupled to the plurality of mean square detectors for combining the output signals of the plurality of mean square detectors to generate a signal representative of the mean square or root mean square of the RF input signal.

A method for detecting the power of a radio frequency (RF) input signal in accordance with one or more embodiments includes the steps of: (a) generating a plurality of amplified or attenuated versions of an the RF input signal; (b) for each of the plurality of amplified or attenuated versions of the RF input signal, generating a signal representative of the mean square power of the RF input signal for a different input signal level range; and (c) combining the signals generated at step (b) to generate a signal representative of the mean square or root mean square of the RF input signal.

A squaring detector cell in accordance with one or more embodiments comprises a plurality of triple-tail cells having their respective outputs combined together to generate an output of the squaring detector cell. Each of the triple-tail cells comprises a plurality of transistors including a center transistor whose base receives a different offset voltage VC than the center transistor of one or more other triple-tail cells in the squaring detector cell such that each triple-tail cell provides approximate square law characteristics for input signals of different levels.

Various embodiments of the invention are provided in the following detailed description. As will be realized, the invention is capable of other and different embodiments, and its several details may be capable of modifications in various respects, all without departing from the invention. Accordingly, the drawings and description are to be regarded as illustrative in nature and not in a restrictive or limiting sense, with the scope of the application being indicated in the claims.

BRIEF DESCRIPTION OF THE DRAWINGS

Like reference numbers denote generally like parts in the drawings.

DETAILED DESCRIPTION

Logarithmic Mean-Square Power Detector

One or more embodiments of the invention are directed to a detector circuit that accepts a modulated or un-modulated radio frequency (RF) input signal and provides an output that varies as a quasi-linear function of the logarithm of the mean of the square of the RF input signal voltage. The circuit provides an output that varies generally linearly in dB with mean square (MS) voltage of the RF input signal. As the logarithm of the square root of a number is simply half the logarithm of that number, this logarithmic output function of the MS voltage can also serve as a measure of the root mean square (RMS) of the RF input signal voltage just by assuming a different output scaling factor. The circuit provides a wide dynamic range of power detection for input signals with improved output linearity. In some embodiments, the integration bandwidth for the MS calculation is adjustable by the user with external control signals.

Figure 1:
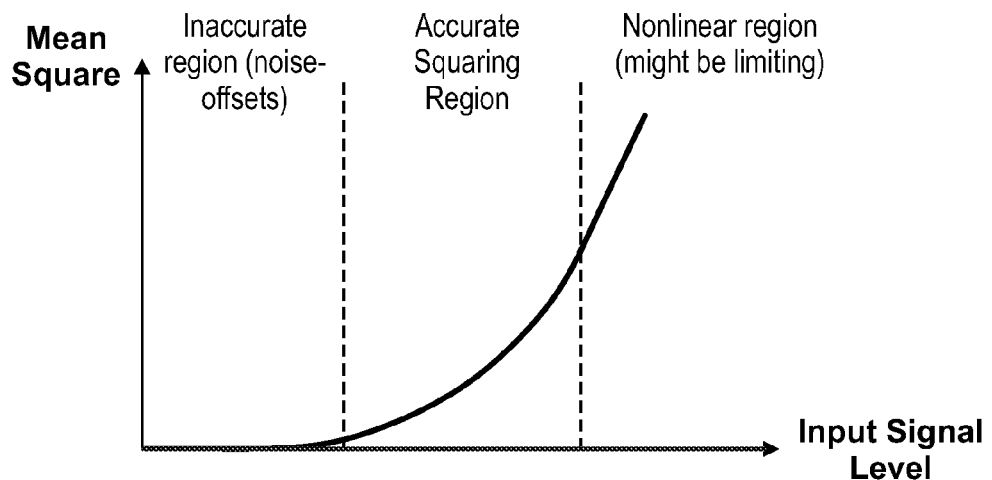
FIG. 1 is a schematic illustration of a mean square detector in accordance with the prior art.
Figure 1:
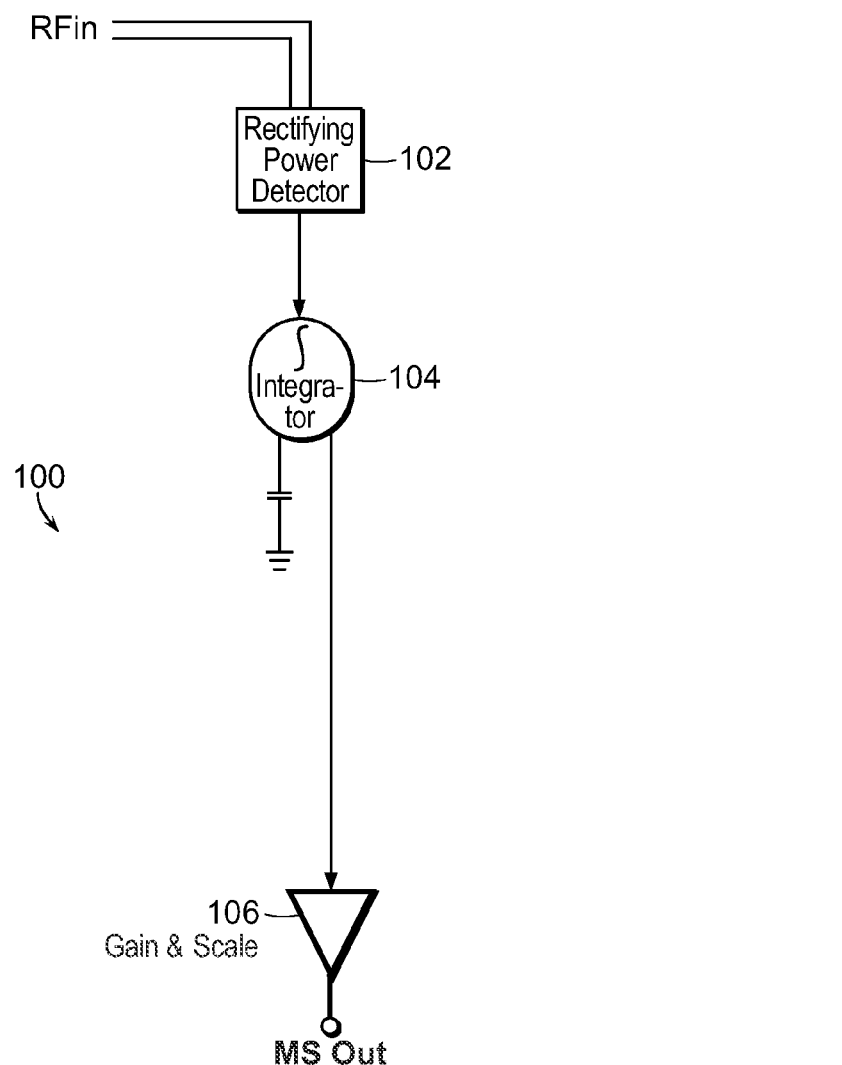

FIG. 1 schematically illustrates a conventional MS detector 100 that includes a rectifying power detector 102, which receives an input RF signal, an integrator 104 (with an external capacitor) coupled to the output of the rectifying power detector 102, and an output driver 106 coupled to the output of the integrator 104. The rectifying power detector 102 detects the signal level of the input RF signal. The integrator 104 averages the detected signal from the power detector 102.

As illustrated in the graph accompanying FIG. 1, the rectifying power detector 100 has multiple operating regions depending on the input signal levels. For very low input signal levels, the output of the detector 100 is inaccurate due noise and mismatch/process related offsets that are observed in integrated circuit (IC) processes. For mid signal levels, the output of the detector 100 provides an approximate indication of the square of the input signal. In general, the mean square calculation is only accurate in this region. For very high input signal levels, the detector 100 deviates from the squaring characteristics, and the output for very high input signal levels can saturate depending on the detector type.

The accurate detection/squaring region is usually limited to less than 30-35 dB for conventional IC detectors. The top 10-15 dB of this available range generally should not be used for average power detection if the input signal is a modulated signal with a high crest factor (WCDMA, etc.). The user of such a detector should be careful about the input signal level to avoid detection inaccuracies.

Figure 2:
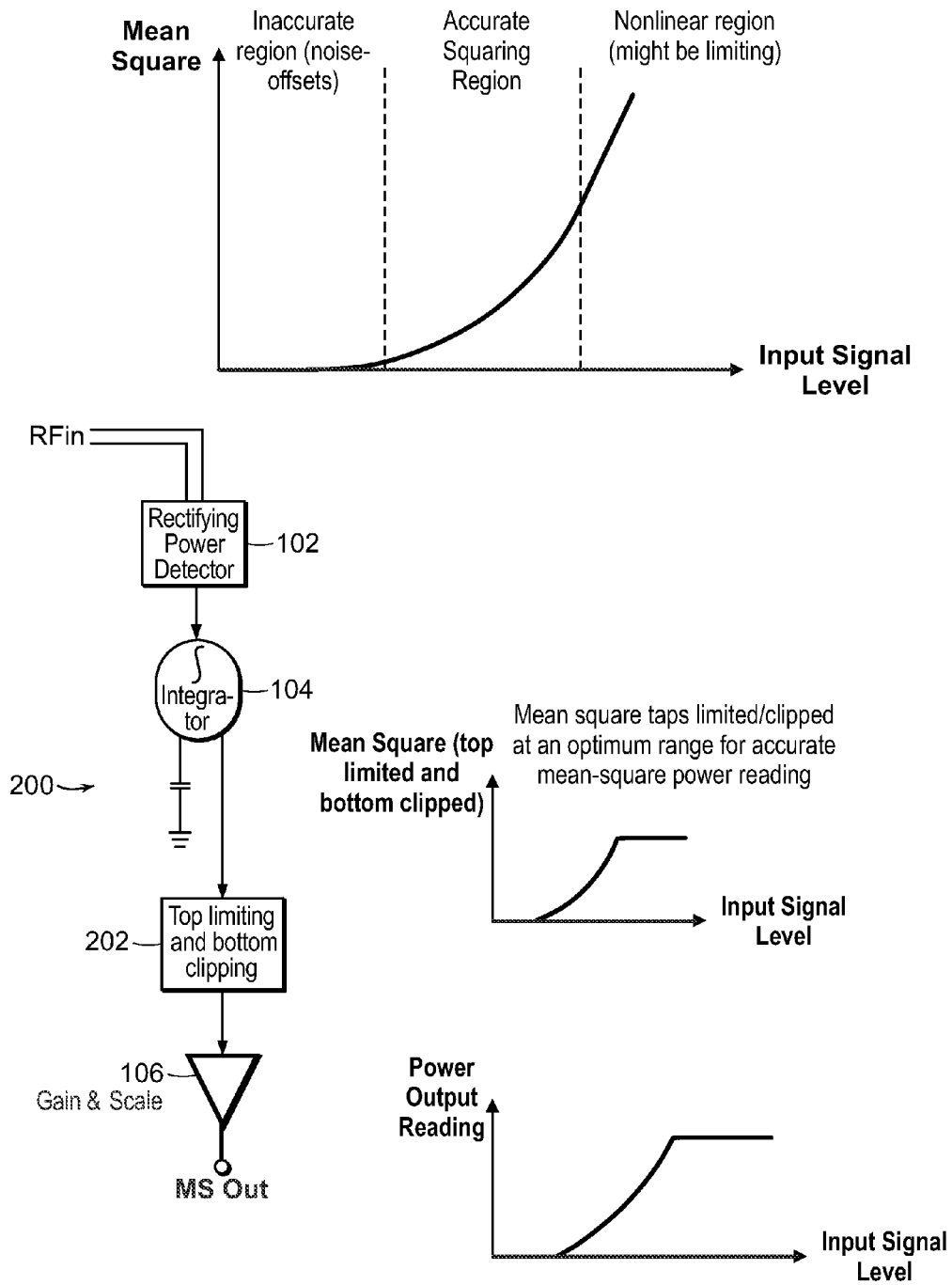
FIG. 2 is a schematic illustration of a mean square detector in accordance with one or more embodiments.

FIG. 2 illustrates a mean square detector 200 in accordance with one or more embodiments of the invention, which improves the performance of the detector 100 of FIG. 1 by limiting the usable input dynamic range of the detector for average power detection. The power detector 200 includes a top limiting/bottom clipping element 202 coupled to the output of the integrator 104, which clips the bottom part of the integrator output to remove inaccurate detected levels due to noise and mismatch. In addition, the element 202 limits of the top part of the integrator output at the highest tolerable squaring level with a back-off margin depending on the maximum crest factor that should be detected. For instance, if the maximum tolerable squaring level is 0 dBm for the rectifying power detector, the limiting can occur at −10 dBm for a maximum crest factor of 10 dB. The detector 200 does not provide any output if the input signal level is too low and provides a limited output signal level if the input signal is out of the detectable input range.

Figure 3:
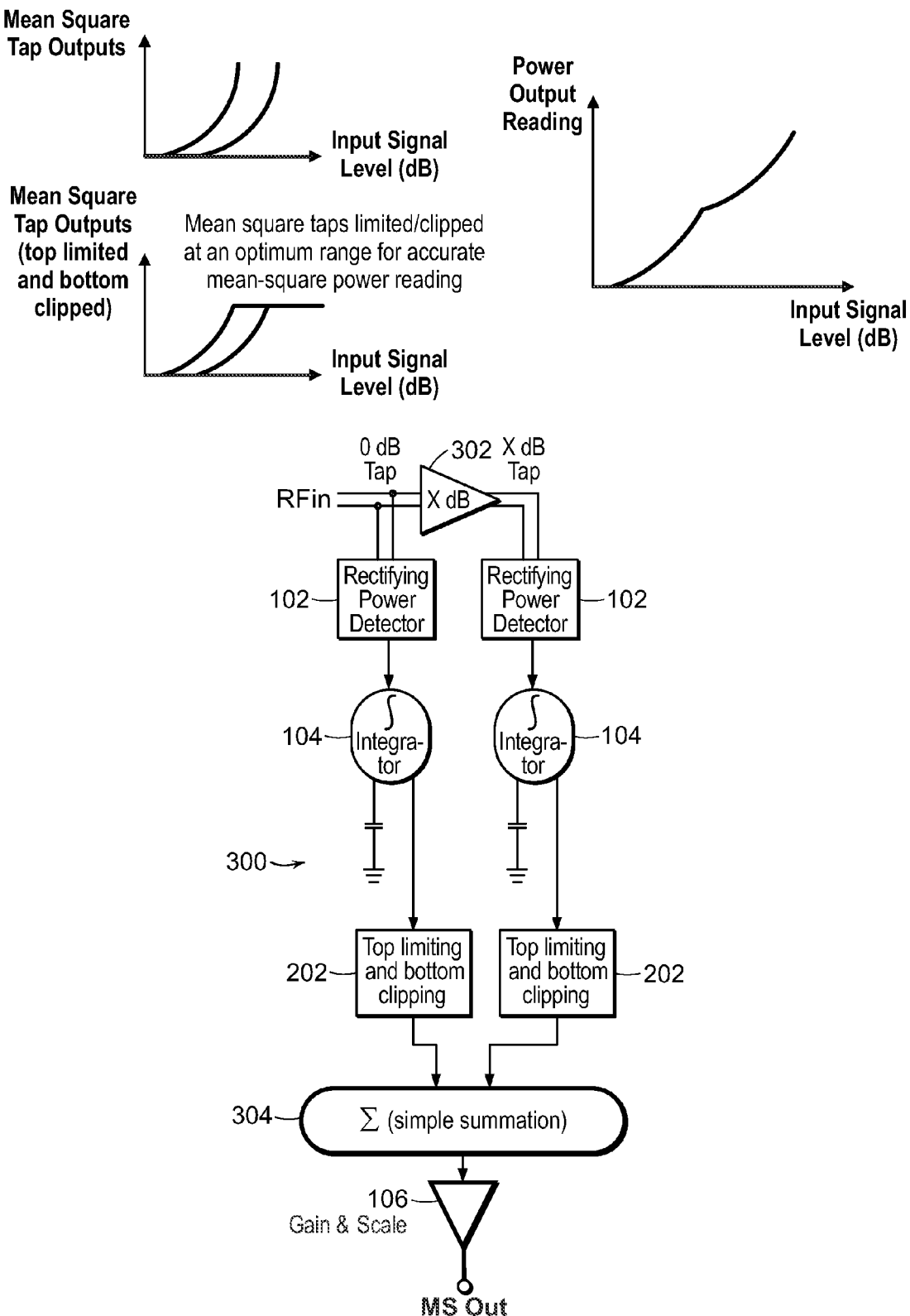
FIG. 3 is a schematic illustration of a mean square detector in accordance with one or more further embodiments.

FIG. 3 illustrates a mean square detector 300 in accordance with one or more embodiments of the invention, which improves the dynamic range of the detector 200 of FIG. 2 by using multiple power detectors. The detector 300 includes two rectifying power detectors 102. The first power detector 102 directly receives the input RF signal (or any attenuated or amplified version of the input signal). The second detector 102 receives an amplified (or attenuated) version of the signal that is coupled to the input of the first detector through an amplifier 302 or an attenuator (not shown). Accordingly, the second detector provides an accurate mean square power reading for a shifted range of input signal levels. For example, if there is a 6 dB gain between first and second detector inputs, and the first detector detects the signal level for an input signal range of −20 dBm to −10 dBm, the second detector will detect the signal level for an input signal range of −26 dBm to −16 dBm.

The outputs of these detectors are summed by a summing element 304. The summed output signal of both detectors represents the mean square power of the input signal level that is determined by a combination of the gain/attenuation of the input signal and the dynamic range of individual detectors. For example, the combined dynamic range for the above example is −26 dBm to −10 dBm, which is larger than the range for either of the individual detectors.

Figure 4:
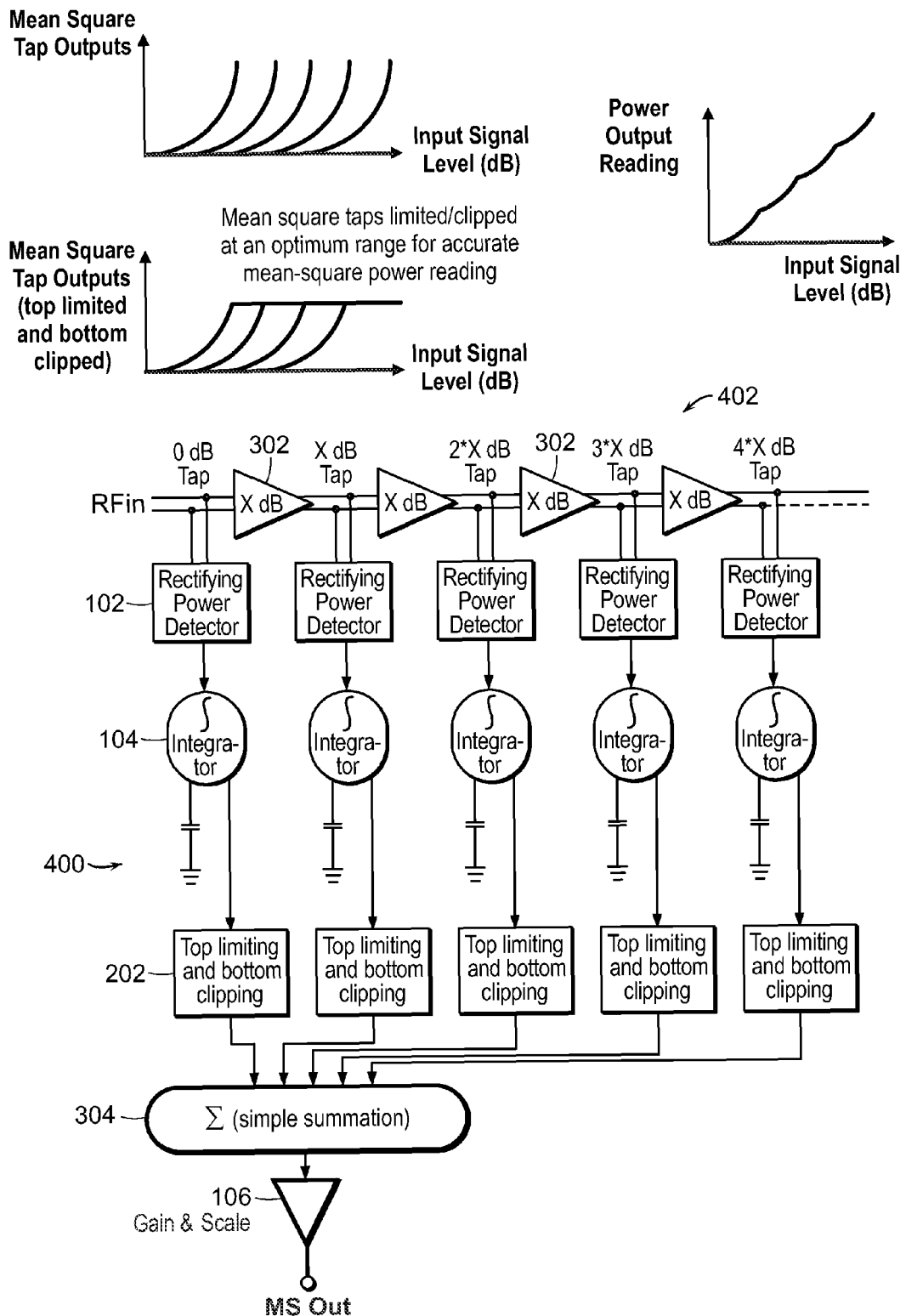
FIG. 4 is a schematic illustration of a mean square detector in accordance with one or more further embodiments.

FIG. 4 illustrates a mean square detector 400 in accordance with one or more further embodiments of the invention. The dynamic range extension technique described in the FIG. 3 embodiment can be extended to construct a wide range MS power detector. As shown in FIG. 4, the input signal to the MS detector 400 is initially processed by an amplifier chain 402 generating multiple taps of the input signal that are separated from each other by a specific amount of gain. Although not shown, an attenuator chain can also be used to increase dynamic range for high power levels to very low power levels, or only an attenuator chain can be used to detect high power levels. Alternatively, the gain/attenuation taps can be generated by parallel gain/attenuation operations or a combination of parallel/series gain/attenuation operations. In the FIG. 4 embodiment, if we assume that there are N gain operations of X dB, the total ratio in dB between the maximum amplification and input is NX dB. Including the neutral input, there are (N+1) gain taps. (The neutral input is coupled to the system input, which is processed by subsequent gain or attenuation operations.)

In this embodiment, all the gain and attenuation operations are implemented differentially. It should be understood however that a single-ended implementation can also be used. The gain/attenuation taps can be buffered before driving the next operation. The tap ratio separation X can be stabilized over temperature, supply, and process variations using suitable biasing techniques.

For example, if the mean square power detector system 400 has 8 detector operations with 6 dB of gain difference between operations and each detector has a detection range of −20 dBm to −10 dBm, the total dynamic range for mean square detection system is −10 dBm to −68 dBm, or 58 dB (input detector: −10 dBm to −20 dBm, the detector after first gain operation: −16 dBm to −26 dBm, . . . , the last detector operation: −58 dBm to −68 dBm). This dynamic range is obtained when the outputs of all detectors are summed.

The outputs of all MS detector operations are summed, generating a detector system output that can be pseudo logarithmic with respect to the mean square of the RF input signal.

Advantages of the MS detector 400 can be seen in the graphs accompanying FIG. 4. Every detector operation provides an output voltage range of 0 to V, and the amplification/attenuation separation between operations is X dB. In this embodiment, the separation (X dB) is smaller than the dynamic range of a single detector (Y dB). Accordingly, for some parts of the system input signal range, more than one detector is active (i.e., where it is not clipped or limited, and thereby contributing to the detector system output). Increasing the system input signal level gradually, assuming that one detector is just saturated, the total detector output signal is mV+k; where k designates the contribution of the next detector to the output (when the previous one is just saturated) and m is the total number of the detectors that are saturated. If the system input signal level is further increased to saturate the next detector, the total detector output signal is (m+1)V+k. Therefore, the detector system output increases by V for every X dB increase in the input signal level that corresponds to pseudo or approximate logarithmic characteristics.

Figure 5:
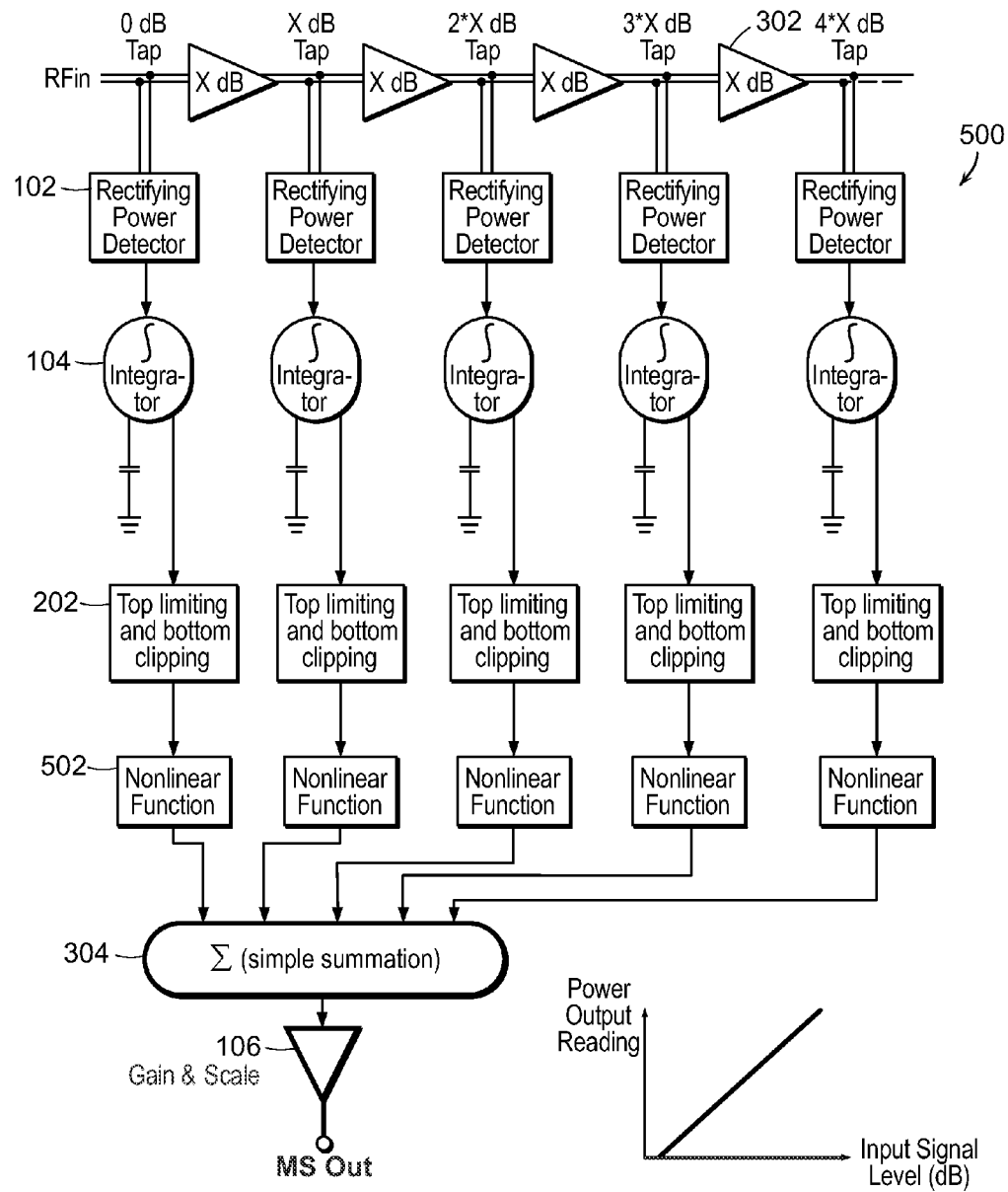
FIG. 5 is a schematic illustration of a mean square detector in accordance with one or more further embodiments.
Figure 5:
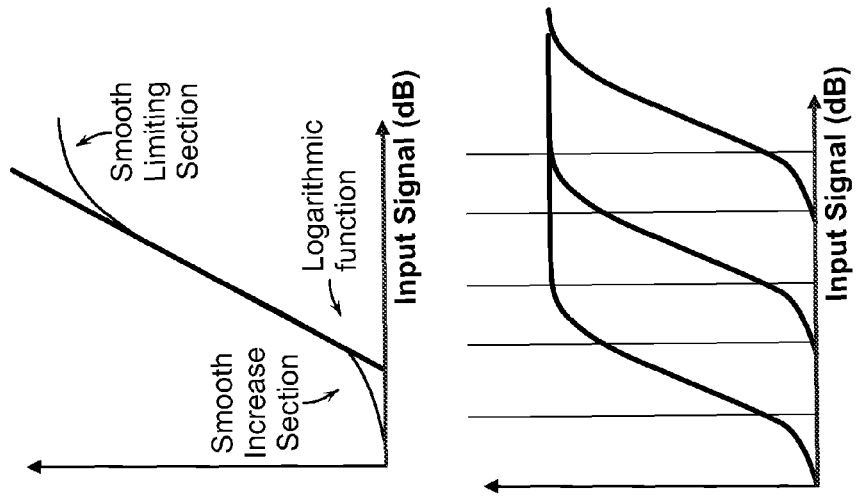
Figure 5:
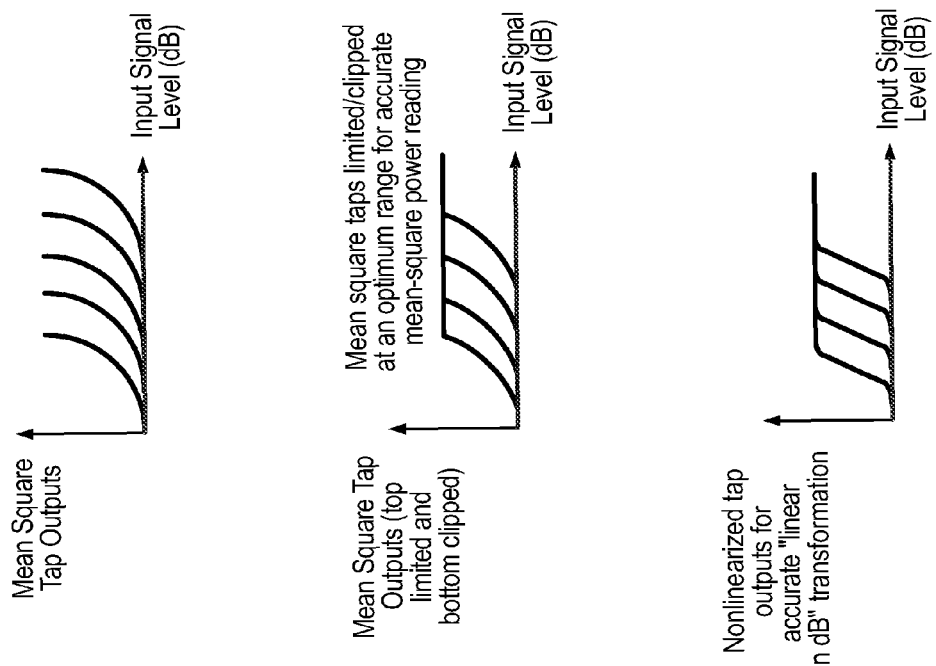

FIG. 5 illustrates a mean square detector 500 with improved logarithmic response in accordance with one or more further embodiments of the invention. The detector 500 provides improved logarithmic characteristics (linear in dB) from input signal level to output power reading signal (which can be voltage or current). In the FIG. 4 embodiment, although the output approximately follows a logarithmic function between input signal level and output, there can be a large deviation (periodic if all gain/attenuation taps are equivalent) when compared to an ideal logarithmic function. One reason for the deviation is that every single detector operation has squaring characteristics that may be far from approximating a logarithmic function. Another reason for the deviation is that multiple detector operations contribute to the output for some ranges of the input signal, while single detector operations contribute to the output for some other ranges of the input signal. Using a logarithmic transformation to the top limiting bottom clipping operation before summation can result in a better logarithmic approximation, but it does not solve the second part of the problem (i.e., single detectors contribute for some input signal ranges, while multiple detectors contribute for other input signal ranges). Using only logarithmic transformation may result in the best logarithmic approximation if the individual detector dynamic ranges (Y) are approximately equal to the gain/attenuation tap separation X. For this condition, only a single detector contributes to the output for a given part of the input signal range.

In accordance with one or more embodiments of the invention, a nonlinear transformation is performed by nonlinear transformation elements 502 after every detector operation for providing improved overall linear-in-dB characteristics between the input signal level and output of the mean square power detector system. The nonlinear transformation in this embodiment includes an approximate logarithmic response for mid-range input signal levels (the input signal being the output of the clipped/limited mean square detector operation) with a smooth increase at low input signal levels and smooth limiting at high signal levels as shown, e.g., in the graphs accompanying FIG. 5. In the MS power detector 500, the output can closely approximate a logarithmic function if the smooth increase sections of the individual detector operations align with the smooth limiting sections of the previous operation (the operation that has more gain at its input) with a single detector operation contributing to the output when that operation is in the logarithmic region (with other detector operations being saturated-limited or at zero level). It should be understood that this is only one example of a nonlinear transformation type that results in better logarithmic response from the mean square power detector system. Other nonlinear transformation types can also be used to improve the logarithmic response.

In accordance with one or more alternate embodiments, the nonlinear transformation elements 502 can be coupled to the outputs of the integrators 104. The top and bottom clipping elements 202 can be coupled between the nonlinear transformation elements 502 and the summing element 304.

Figure 6:
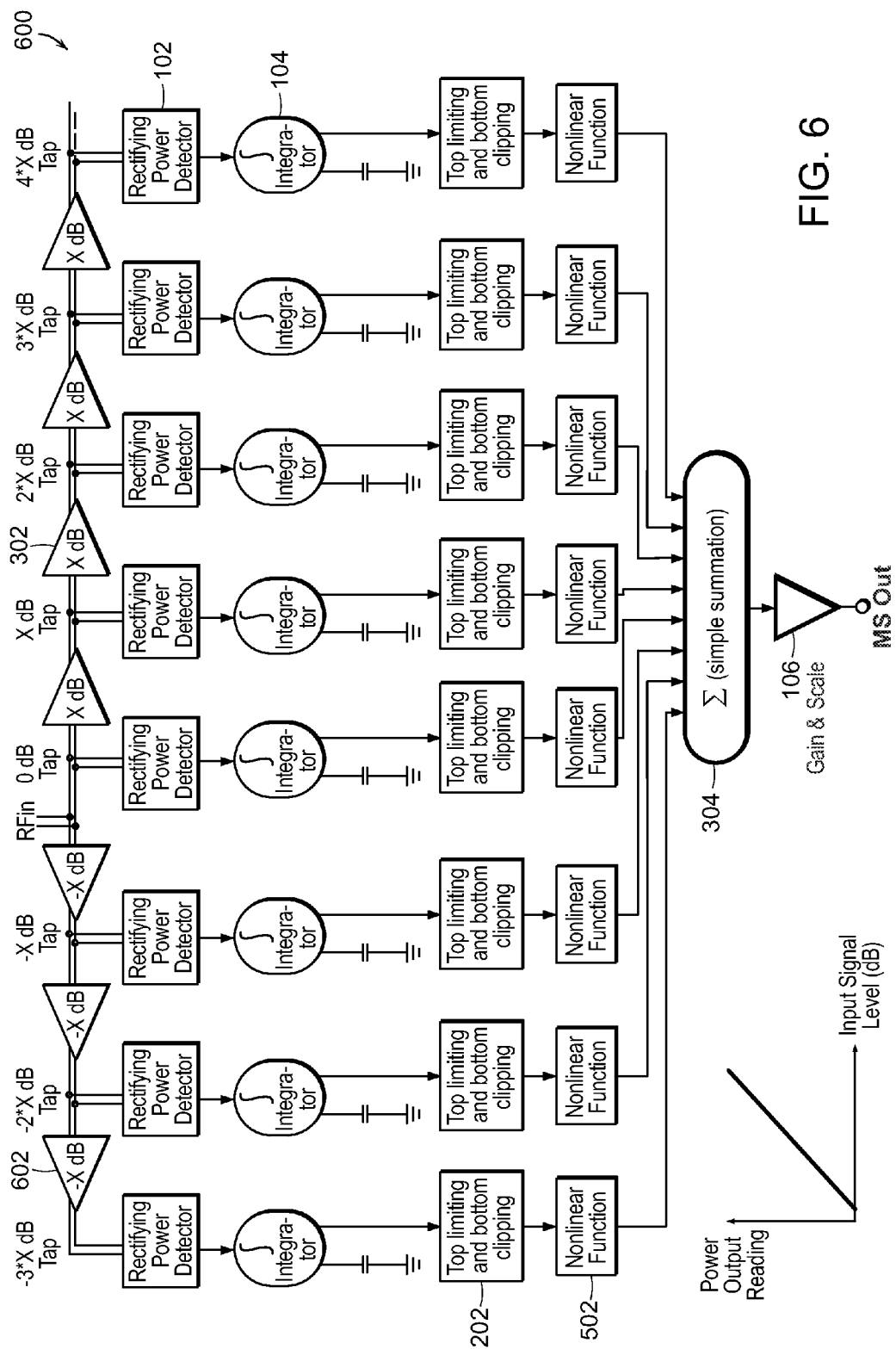
FIG. 6 is a schematic illustration of a mean square detector in accordance with one or more further embodiments.
Figure 6:
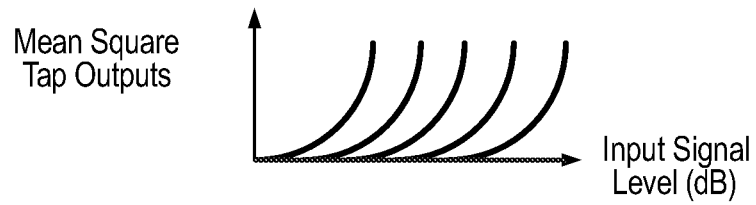
Figure 6:
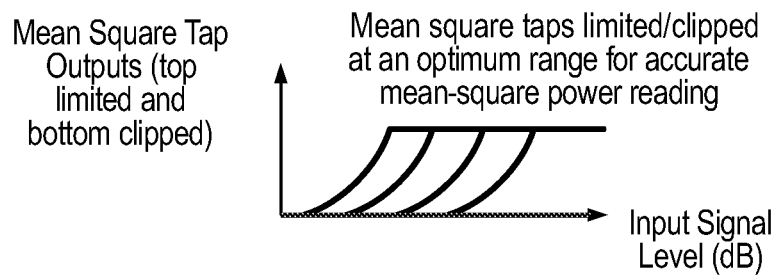
Figure 6:
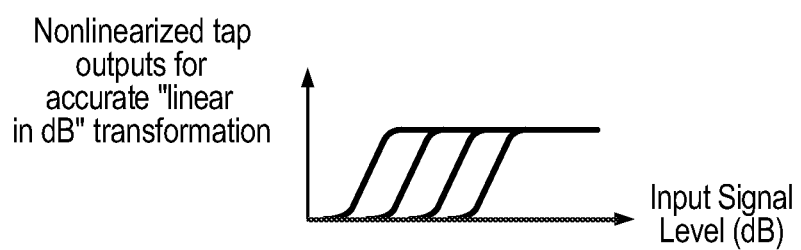

FIG. 6 illustrates a wide dynamic range MS detector 600 with nonlinear transformation in accordance with one or more further embodiments of the invention. FIG. 6 shows how the dynamic range of the system illustrated in FIG. 5 can be expanded by using an attenuator chain (comprising a plurality of attenuators 602) and an amplifier chain (comprising a plurality of amplifiers 302) to generate a wide range of signal levels between the maximum amplification and attenuation.

In this embodiment, the input signal to the MS detector 600 is initially processed by an amplifier chain and an attenuator chain generating multiple taps of the input signal that are separated from each other by a given amount of gain. If we assume that there are N gain operations of X dB and M attenuation operations of –X dB, the total ratio in dB between the maximum amplification and maximum attenuation is (M+N)X dB. Including the neutral input, there are (M+N+1) gain taps. (The neutral input is coupled to the system input, which is processed by subsequent gain or attenuation operations.)

In the detector 600, all the gain and attenuation operations can be implemented differentially, although single-ended implementation can also be used. The gain taps can be buffered before driving the next operation. Tap ratio separation X can be stabilized over temperature, supply, and process variations using suitable biasing techniques.

For example, if the system has eight amplification operations of each 6 dB, four attenuation operations of each 6 dB, and a mean square detector operating from –20 dBm to –10 dBm, the maximum detected signal will be 14 dBm (top detector operating from 14 dBm to 4 dBm) and the minimum detected signal will be –68 dBm (bottom detector operating from –68 dBm to –58 dBm), providing an ideal dynamic range of 82 dB. In many practical applications, the top end of the top detector (highest attenuation) and the bottom end of the bottom detector (highest gain) will shift from the logarithmic approximation with an achievable dynamic range of about 75 dB.

Figure 7:
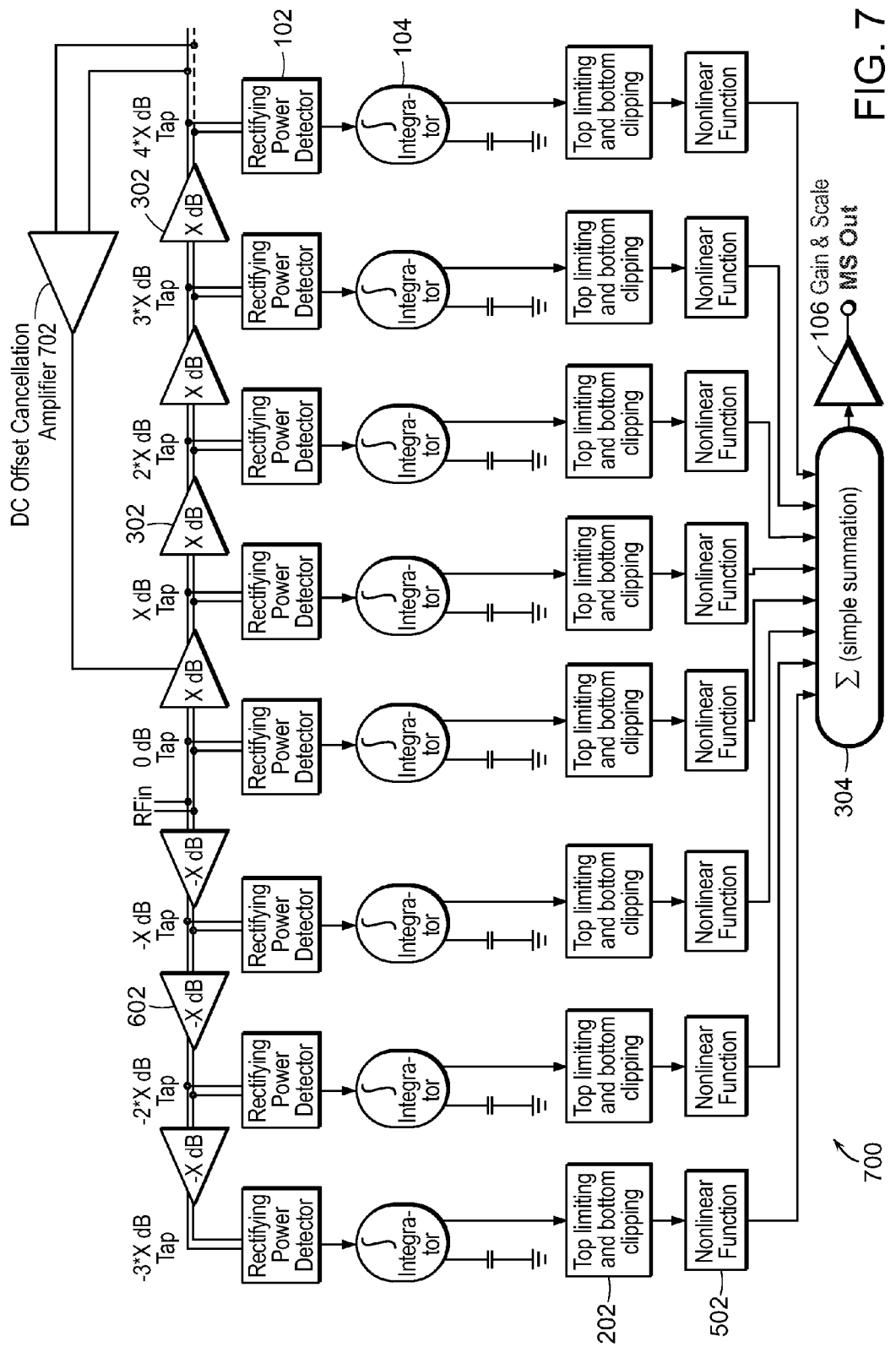
FIG. 7 is a schematic illustration of a mean square detector in accordance with one or more further embodiments.
Figure 7:
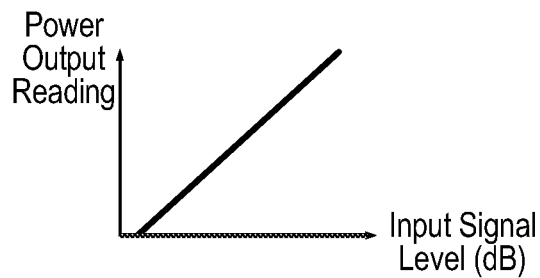
Figure 7:
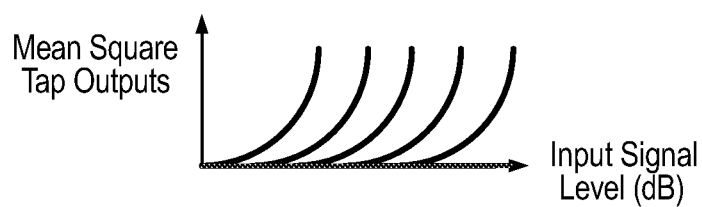
Figure 7:
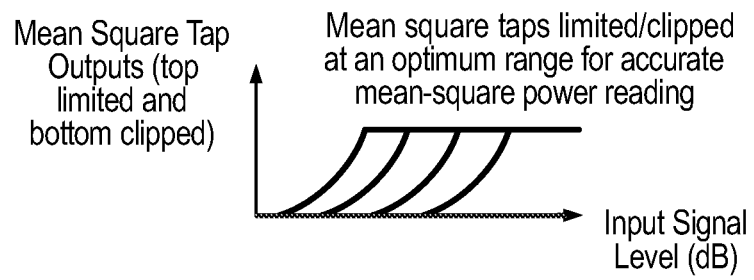
Figure 7:
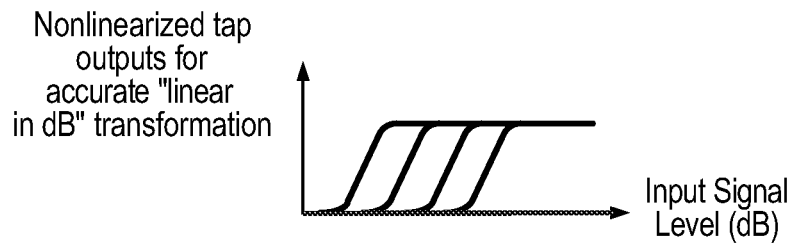

FIG. 7 illustrates a wide dynamic range MS detector 700 with nonlinear transformation in accordance with one or more further embodiments of the invention. One improvement of the FIG. 7 embodiment over the FIG. 6 embodiment is the inclusion of a DC offset cancellation feedback loop 702 around the amplifier chain. The DC offset cancellation feedback loop 702 helps to avoid the saturation of the high-end (highest gain) amplifiers in the chain due to DC offsets, which exist in any real IC amplifier. The accuracies of the detector operations are also improved by reducing the uncertainty in the input signal levels.

Figure 8:
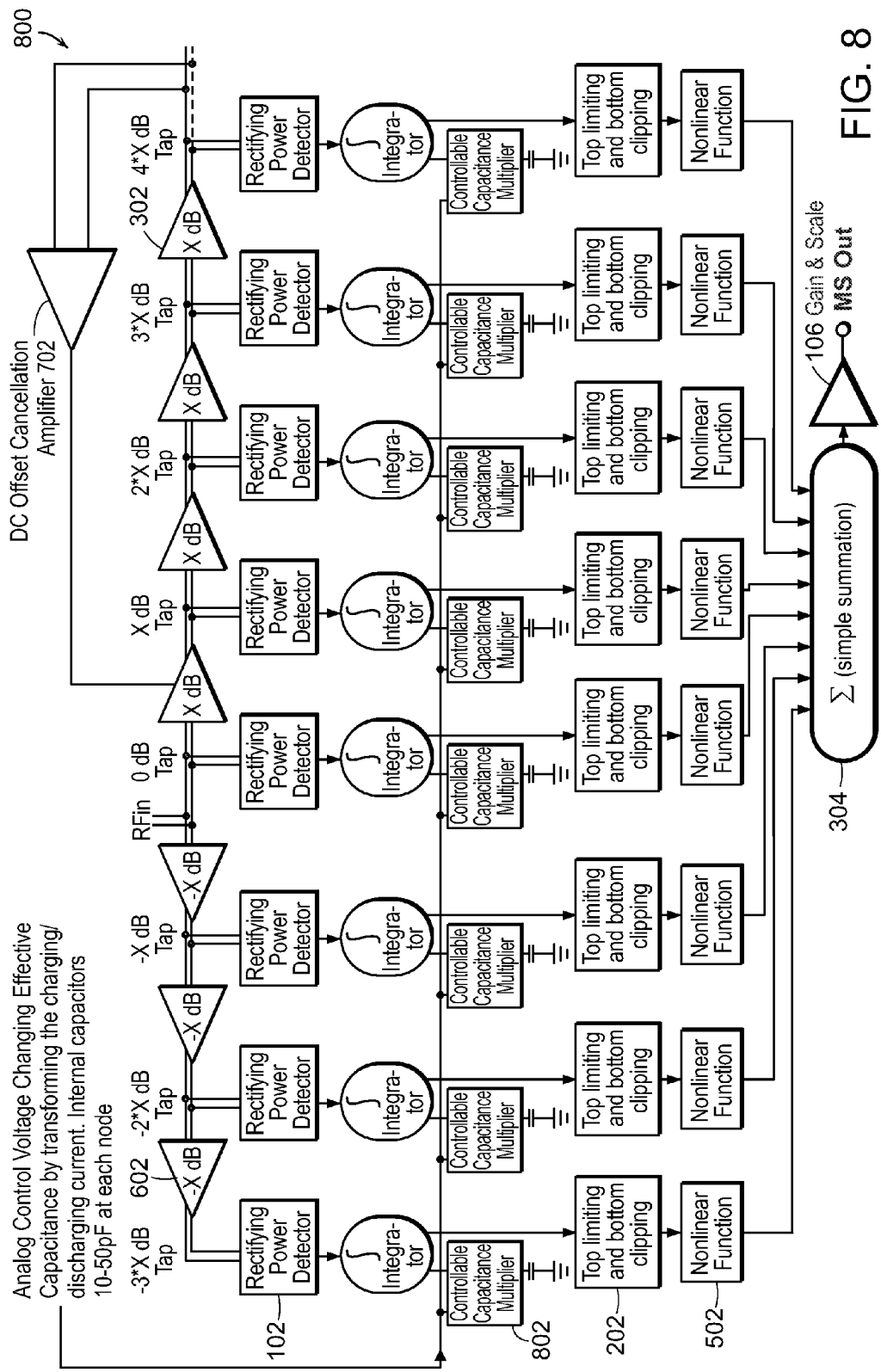
FIG. 8 is a schematic illustration of a mean square detector in accordance with one or more further embodiments.
Figure 8:
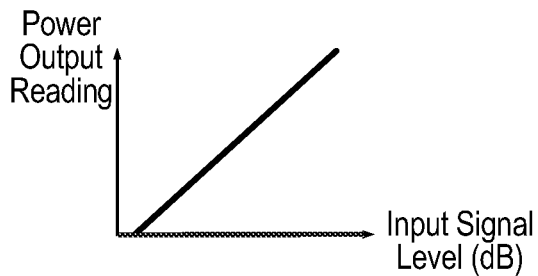
Figure 8:
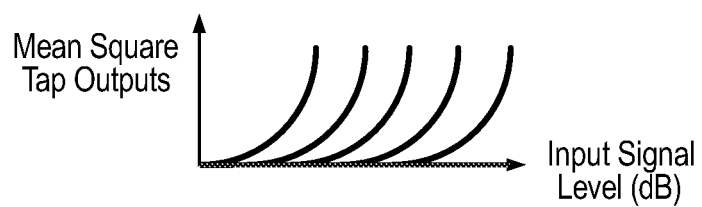
Figure 8:
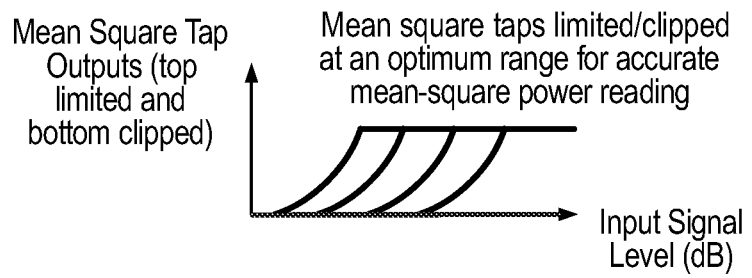
Figure 8:
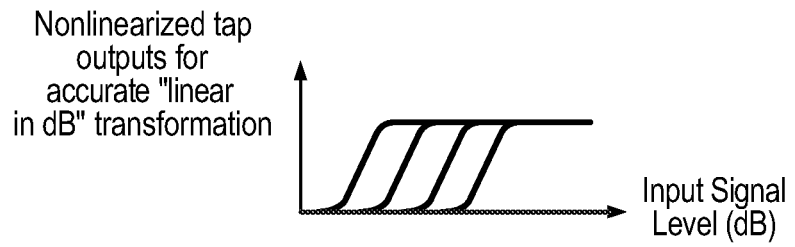

FIG. 8 illustrates a wide dynamic range MS detector 800 with nonlinear transformation utilizing capacitance multiplication in accordance with one or more further embodiments of the invention.

Accurate mean square calculation of high-crest factor modulated signals (e.g., CDMA2000, WCDMA, and LTE) involves very long integration time constants, and is not easily achievable using on-chip capacitors. For this reason, some power detectors use external capacitors for obtaining the required long time constants. In accordance with one or more embodiments of the invention, externally adjustable capacitance multipliers 802 are provided at each integration node to obtain integration time constants by using practical on-chip capacitor values (10-50 pF) for each mean square detector operation. The capacitance multiplier can obtain multiplication ratios of more than 1000 in practical applications.

In embodiments described above, the top limiting/bottom clipping elements 202 for each detection channel are the same, and the nonlinear transformation elements 502 for each detection channel are also the same. In one or more alternate embodiments, the nonlinear transformation elements 502 can optionally provide different functions in each detection channel, and the top limiting/bottom clipping elements 202 can limit/clip at different levels of the mean-squared taps to improve the dynamic range of the mean-square power detector system or to change the input signal level—output transfer characteristics of the system. For example, the lowest gain detection channel that operates with the highest power signals (upper end of the transfer curve) maybe modified by increasing the top-limiting level and using a different nonlinear transformation to increase the detection dynamic range for highest level input signals.

In the embodiments described above, the detectors 102 may exhibit output signal levels for zero input signal levels that change with process and temperature variations, which may limit their accuracy particularly for low signal levels. The output of individual detectors 102 at zero input signal levels can optionally be removed using a zeroing bias operation.

In summary, a mean square power detector in accordance with one or more embodiments of the invention includes a plurality of MS detectors, some of which are driven with amplified or attenuated versions of an input signal to obtain a wider range of MS power detection than a single MS detector. The amplified or attenuated versions of the input signal can be obtained by using a series of gain or attenuation operations that progressively amplify or attenuate the input signal. In an alternative embodiment, the amplified or attenuated versions of the input signal can be obtained by using parallel gain or attenuation operations.

In accordance with one or more embodiments, the outputs of the MS detectors are processed by a nonlinear transformation element and summed to obtain the wide-range mean square detected signal. This signal varies as a quasi-linear function of the logarithm of the mean of the square of the RF input signal voltage.

In accordance with one or more embodiments, the outputs of the MS detectors are bottom clipped to remove the inaccurate detection range resulting from noise/mismatch.

In accordance with one or more embodiments, the outputs of the MS detectors are top limited to remove the inaccurate detection range resulting from shifting from squaring characteristics.

In accordance with one or more embodiments, the top limited and bottom clipped outputs of the individual MS detectors are processed by a nonlinear transformation element before summation such that the final output signal (the result of summation) varies as a more accurate quasi-linear function of the logarithm of the mean of the square of the RF input signal voltage with reduced variation or deviation from the linear-in-dB characteristics. In particular, the nonlinear transformation produces an output that is approximately logarithmic for mid-range signals with smooth increase and smooth limiting sections for low and high range signals.

In accordance with one or more embodiments, some of the "top-limiting, bottom clipping" operations and nonlinear transformations maybe different from others for improving the detection dynamic range or for obtaining different transfer characteristics.

In accordance with one or more embodiments, the outputs of individual detectors 102 at zero input signal levels can be removed using a zeroing bias operation dependent on process and temperature variations.

In accordance with one or more embodiments, long integration time constants for accurate mean square calculation of some modulated signals are obtained by using integrated capacitors (instead of external capacitors) and a capacitance multiplier circuit. In other embodiments, external capacitors can be used.

Multiple Stage Squaring Detector

Accurate calculation of the root mean square (RMS) power of complex modulated signals can be made using a squaring detector that provides an approximate square-law function for a specific range of the input signal, which is known as the dynamic range of the squaring detector. Prior art squaring detectors generally provide approximate square-law characteristics only for a limited range of input signal levels, which results in performance limitations or difficulties in power detector design. Some architectures use servo feedback loop techniques to limit the operation range of the squaring detectors. Accuracy in detecting high-crest factor signals depends in part on the dynamic range of the squaring detector.

Further embodiments are directed to squaring detectors with improved dynamic range. By way of example, such squaring detectors can be used in detector circuits (such as the mean square power detectors described above) that calculate the RMS power of a complex modulated signal. As discussed above, such detector circuits accept a modulated or un-modulated RF input signal and provide an output that varies as a quasi-linear function of the logarithm of the mean of the square of the RF input signal voltage. The circuit provides an output that varies linearly in dB with MS voltage of the RF signal. The circuit provides a wide dynamic range of power detection for input signals with improved output linearity. The integration bandwidth for the MS calculation can be adjustable by the user with external control signals.

Figure 9A:
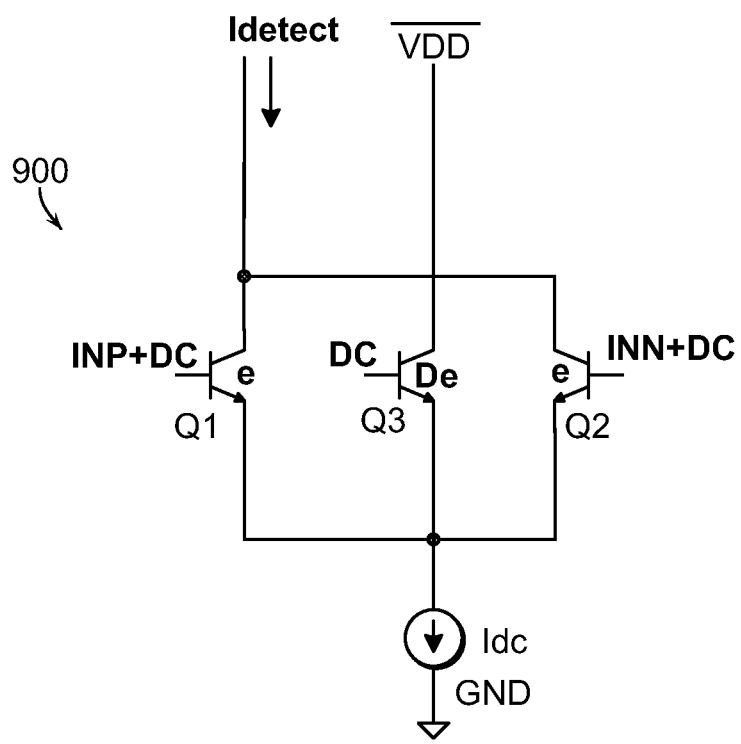
FIG. 9A is a schematic illustration of a squaring detector cell in accordance with the prior art.

FIG. 9A illustrates a prior art full-wave rectifier 900 incorporating a triple-tail cell that can be used as a squaring detector. The structure includes three emitter-coupled npn bipolar transistors Q1, Q2, Q3 and a current source coupled to the common-emitter generating a tail-current Idc. The transistors Q1 and Q2 form a differential pair with emitter areas equal to each other while the transistor Q3 has an emitter area D times as large as those of the transistors Q1 and Q2. The constant D maybe unity, and it maybe greater or less than unity. Collectors of transistors Q1 and Q2 are coupled together forming the output terminal of the detector cell while the collector of Q3 is coupled to an AC ground. In this configuration, a differential input voltage Vinp=INP-INN is applied between the bases of the transistors Q1 and Q2 with a dc voltage component denoted as "DC". The base of the center transistor Q3 receives only the dc component "DC". In another example, the center transistor may receive a parasitic RF component. In a further example, one of the transistors in the differential pair Q1-Q2 may receive a DC voltage at its base and the other two transistors (one of Q1-Q2 and also Q3) may receive input signals that effectively generate a differential voltage across base inputs of Q1–Q3 (=Vinp/2) and Q2–Q3 (=−Vinp/2).

The output current Idetect of the triple-tail cell that is outputted from the coupled collectors of Q1 and Q2 can be determined from the following equation.

$$Idetect = \frac{2\alpha_f I_0}{2\cosh\left(\frac{Vinp}{2V_T}\right) + D}$$

Here $V_T$ is the thermal voltage of the transistors defined as $V_T=(kT)/q$, where k is the Boltzmann's constant, T is the absolute temperature in degrees Kelvin, q is the charge of an electron, and $\alpha_f$ is the dc common-base current gain factor of the transistors Q1, Q2 and Q3.

Figure 9B:
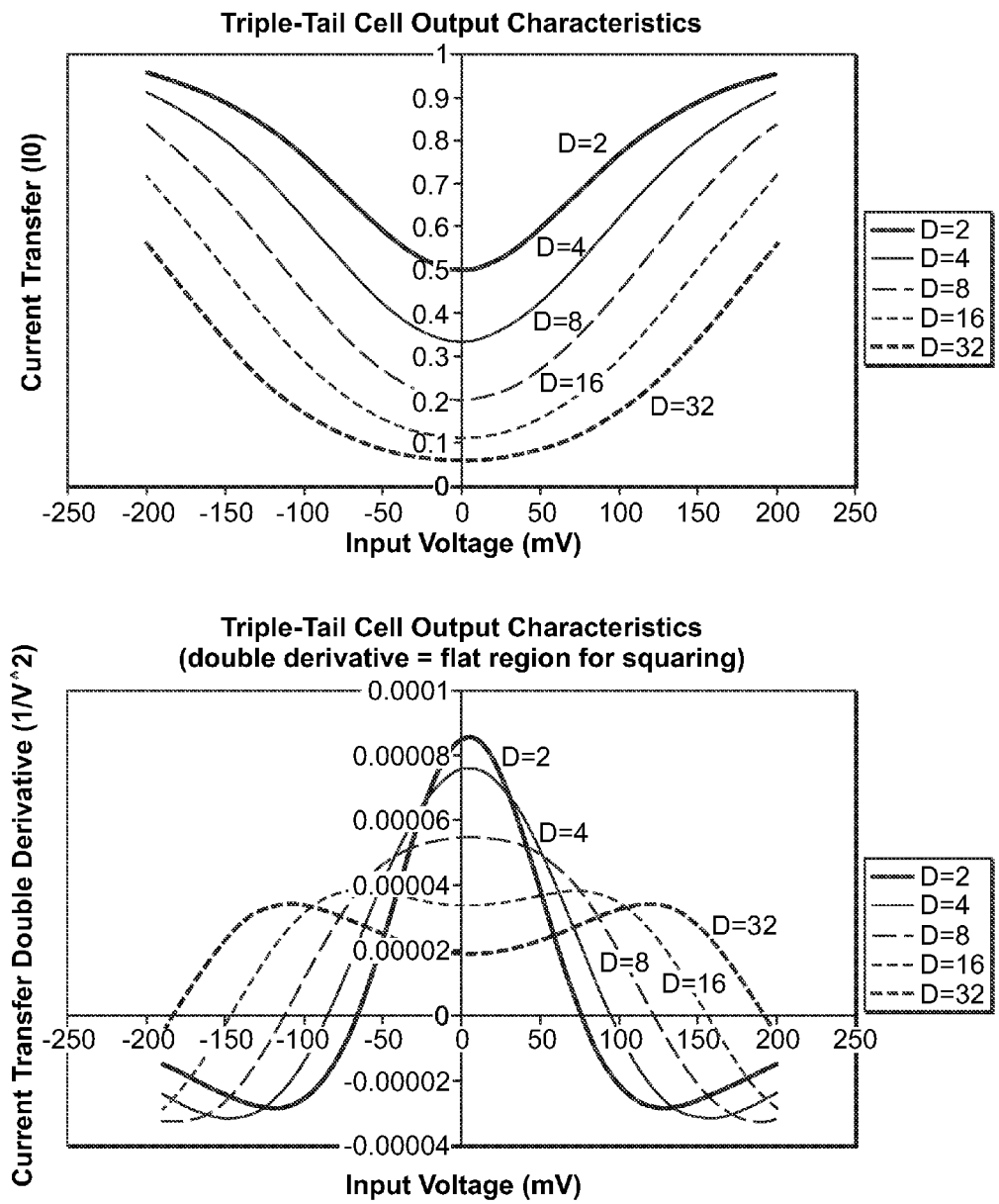
FIG. 9B graphically illustrates output characteristics of the squaring detector cell of FIG. 9A.

The output characteristics of this prior art detector cell 900 are shown in FIG. 9B. As shown, Idetect has full-wave rectification characteristics and a range of input-signal levels where it provides approximate square-law characteristics. The input signal range of the approximate square-law characteristics depends on the D factor as a parameter. For lower D values, the approximate square-law range for input signals is narrow, while it gets larger as D is increased. The double derivative of the output characteristics shows that there might be an optimal D value for obtaining the widest squaring range without losing accuracy for low level signals. For D=32, the squaring characteristics (flat region of the double-derivative) is distorted for low signal levels.

Figure 9C:
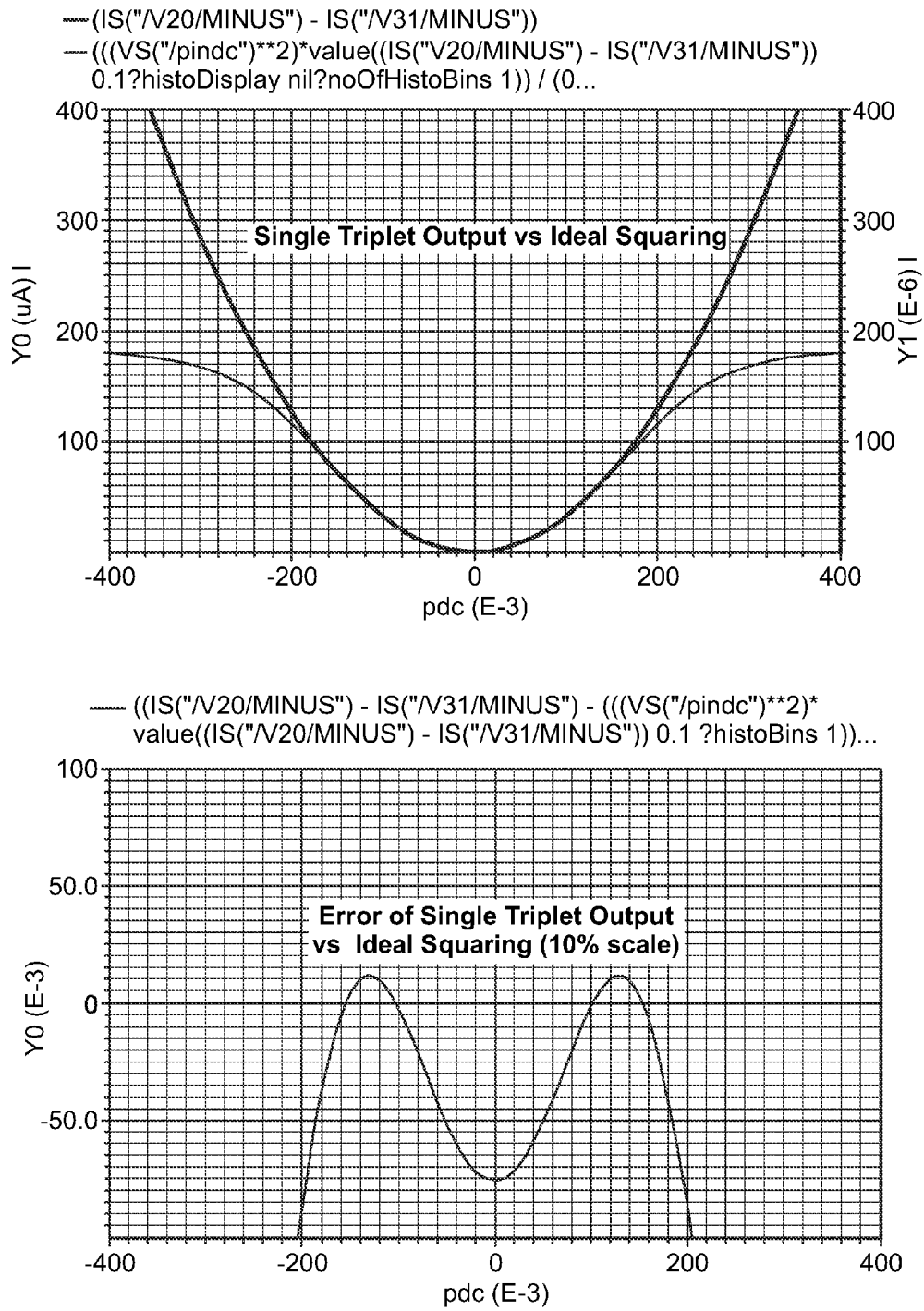
FIG. 9C graphically illustrates the squaring performance of the squaring detector cell of FIG. 9A.

FIG. 9C evaluates the squaring performance of the triple-tail cell 900 for a practical D value of 19 by comparing the output characteristics with an ideal square transfer curve. The error curve plotted on a percentage scale (indicating the percentage shift from ideal squaring characteristics) shows that the maximum usable input signal is limited to about +−200 mV for a 10% error, while providing a significant error of 7% for low signal levels.

Figure 10A:
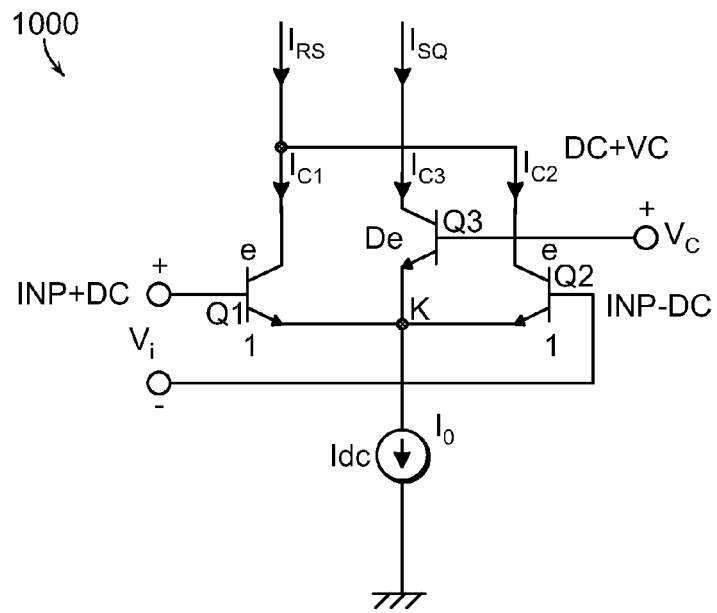
FIG. 10A is a schematic illustration of another squaring detector cell in accordance with the prior art.

FIG. 10A illustrates another prior art full-wave rectifier 1000 incorporating a triple-tail cell that can be used as a squaring detector. Similar to the configuration in FIG. 9A, a differential input voltage Vinp=INP−INN is applied between the bases of the transistors Q1 and Q2 with a dc voltage component denoted as "DC". The base of the center transistor Q3, however, receives an additional offset component VC resulting in a bias voltage value of DC+VC. FIG. 10C illustrates the output characteristics of this detector cell for a sweep of the VC (−25 mV to 75 mV) where the center transistor Q3 size is fixed at 8e (Q1 and Q2 sizes are both e). This shows that changing the VC has a similar effect as changing the size of Q3, and the optimum D value for the widest squaring region might be lower when VC is applied. In addition, this also shows that, for larger VC values, squaring performance can be obtained at much larger signal levels, while squaring is not accurate for lower signal levels.

In another example, the center transistor may receive a parasitic RF component. In a further example, one of the transistors in the differential pair Q1-Q2 may receive a DC voltage at its base and the other two transistors (one of Q1-Q2 and also Q3) may receive input signals that effectively generate a differential voltage across base inputs of Q1−Q3 (=Vinp/2−VC) and Q2−Q3 (=−Vinp/2−VC).

The output current Idetect (indicated in FIG. 10A as $I_{RS}$) of the triple-tail cell, which is outputted from the coupled collectors of Q1 and Q2, can be determined from the following equation:

$$Idetect = \frac{2\alpha_f I_0}{2\cosh\left(\frac{Vinp}{2V_T}\right) + D\exp\left(\frac{VC}{V_T}\right)}$$

Here $V_T$ is the thermal voltage of the transistors defined as $V_T=(kT)/q$, where k is the Boltzmann's constant, T is the absolute temperature in degrees Kelvin, q is the charge of an electron, and $\alpha_f$ is the dc common-base current gain factor of the transistors Q1, Q2 and Q3.

Although the discussion for FIG. 10A assumes that the output current is $I_{RS}$, an approximate square law current can also be obtained from $I_{SQ}$ or from the differential usage of both output terminals. If the output is taken single-endedly, the other output can be coupled to an ac ground (supply etc.).

If the output current has a temperature dependency, this dependency can be compensated for by varying the dc voltage Vc to cancel the temperature-dependent change of the current $I_{RS}$ or $I_{SQ}$.

Figure 10B:
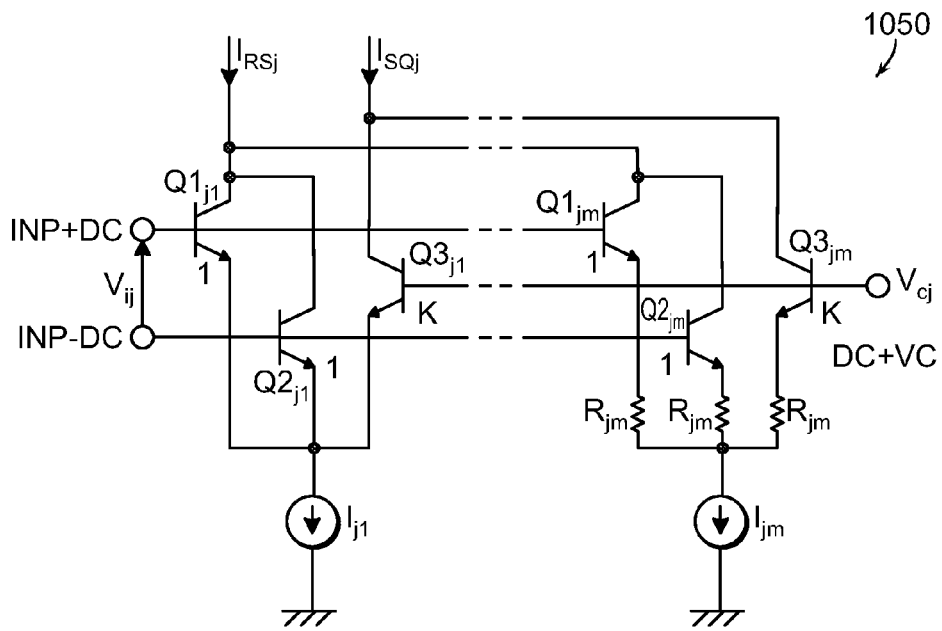
FIG. 10B is a schematic illustration of another squaring detector cell in accordance with the prior art.
Figure 10C:
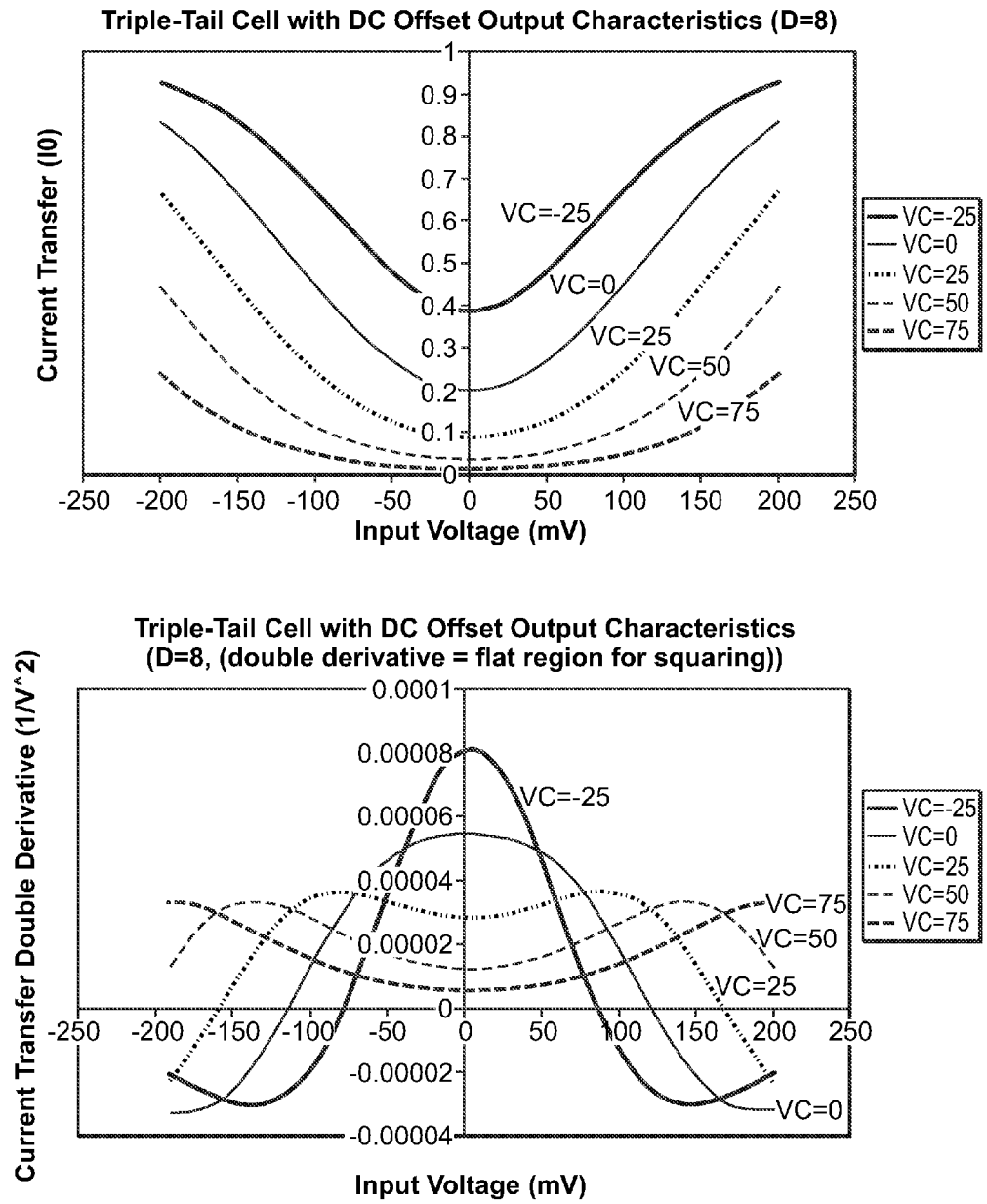
FIG. 10C illustrates the output characteristics of the squaring detector cell of FIG. 10A.

Another prior art detector cell (full-wave rectifier) 1050 shown in FIG. 10B contains a plurality of the bipolar triple-tail cells shown in FIG. 10A. The second to (m−1)th triple-tail cells are the same in configuration as that of the m-th triple tail cell (including degeneration resistors). The bases of the first to m-th transistors $Q3_{j1}$ to $Q3_{jm}$ are coupled together to be applied with a dc voltage of DC+VC.

The emitter resistors for emitter degeneration enable the operating input voltage range of the triple-tail cell to be expanded according to the product of the values of the emitter resistance and the tail current. In this detector cell, if the input voltage ranges of the various stages are adjusted so that the respective input voltage ranges increase or decrease exponentially or like a geometric progression, the rectification characteristic of the bipolar subcircuit itself can be approximated near to the true logarithmic characteristic in a wider input voltage range.

Figure 11:
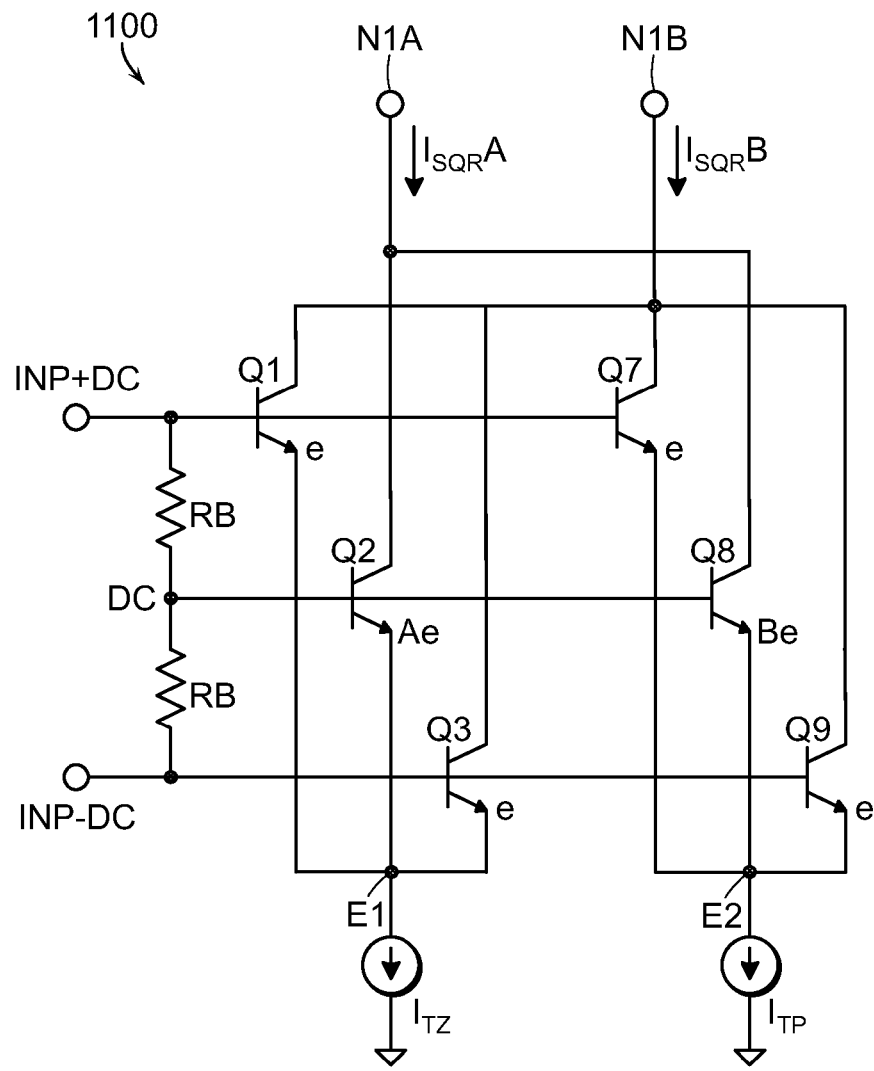
FIG. 11 is a schematic illustration of another squaring detector cell in accordance with the prior art.

FIG. 11 shows yet another prior art detector circuit 1100 using two triple-tail cells for obtaining more consistent characteristics over temperature. The center transistors Q2 and Q8 in the triple-tail cells receive the DC point of the differential input signals that is generated by the resistor ladder ($R_B$ and $R_B$), and they have different emitter areas of Ae and Be. The two overlapping detector cells driven by tail currents having different temperature characteristics may provide a combined output curve that remains constant over a wide range of temperatures. The current source $I_{TZ}$ has a temperature coefficient of zero while the current source $I_{TP}$ has a temperature coefficient of PTAT (proportional to absolute temperature) (or super-PTAT). The emitter area ratio of the transistors in the first triplet can be about 40:1 (Q2 to Q1=Q3), and area ratio of the transistors in the second triplet is about 3.5:1 (Q8 to Q7=Q9).

Figure 12A:
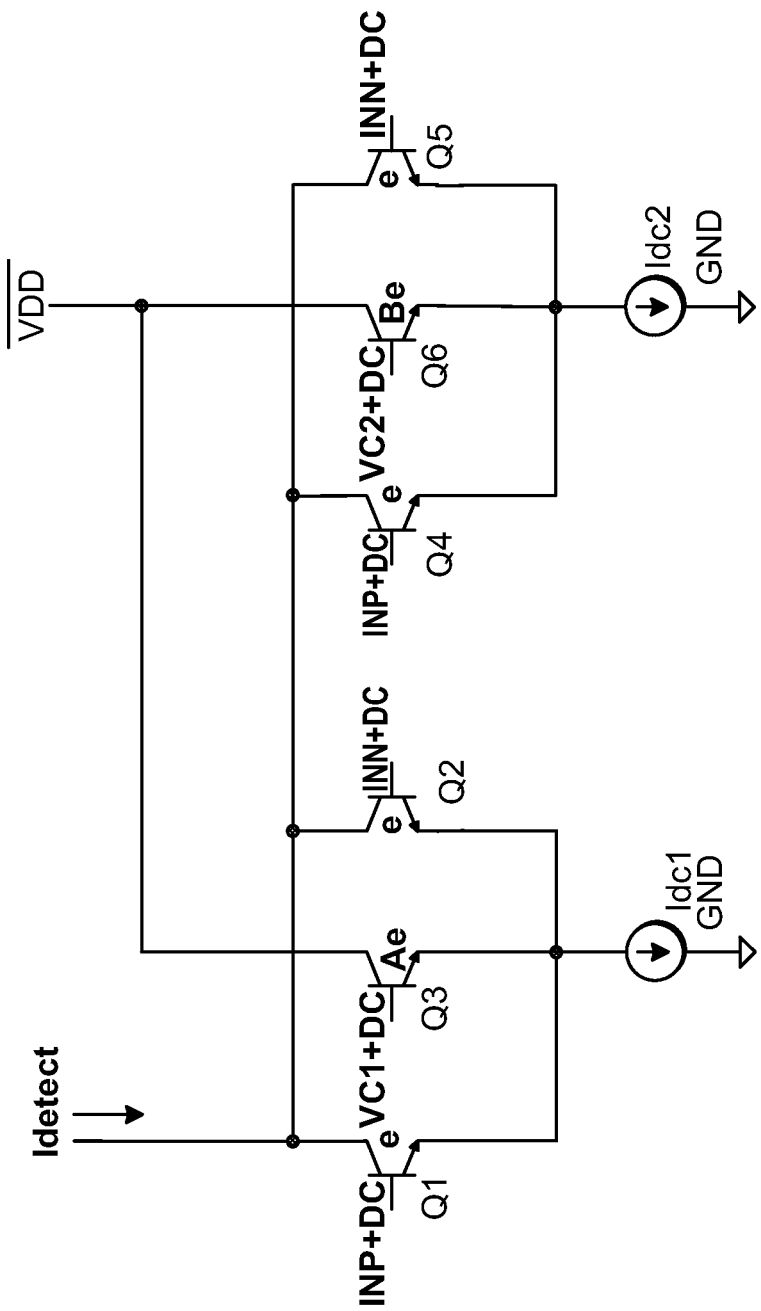
FIG. 12A illustrates a squaring detector cell in accordance with one or more embodiments.

FIG. 12A illustrates a detector cell 1200 in accordance with one or more embodiments of the present invention. The detector cell 1200 includes a plurality of bipolar triple-tail cells such as those shown in FIG. 10A. Similar to the configuration in FIG. 10B, a differential input voltage Vinp=INP−INN is applied between the bases of the transistors Q1 (Q4) and Q2 (Q5) (base of Q4 is coupled to base of Q1 while base of Q5 is coupled to base of Q2) with a DC voltage component denoted as "DC". The base of the center transistors in each triple-tail cell, Q3 and Q6, however, receive additional offset components VC1 and VC2, respectively, resulting in bias voltage values of DC+VC1 and DC+VC2, respectively. Center transistors Q3 and Q6 may have same or different emitter areas (Ae may be equal to Be). The collectors of transistors Q1, Q2, Q4, and Q5 may be coupled to generate the output of the detector while collectors of the center transistors Q3 and Q6 may be coupled to an AC ground such as supply voltage.

In some embodiments, the differential transistors of one triple-tail cell have a different area than the differential transistors of the other triple-tail cell. In the FIG. 12A embodiment, Q1 and Q2 need not have the same size as Q4 and Q5. The ratio Q3/Q1 should be equal to the ratio Q3/Q2, and the ratio Q6/Q4 should be equal to the ratio Q6/Q5.

Figure 13:
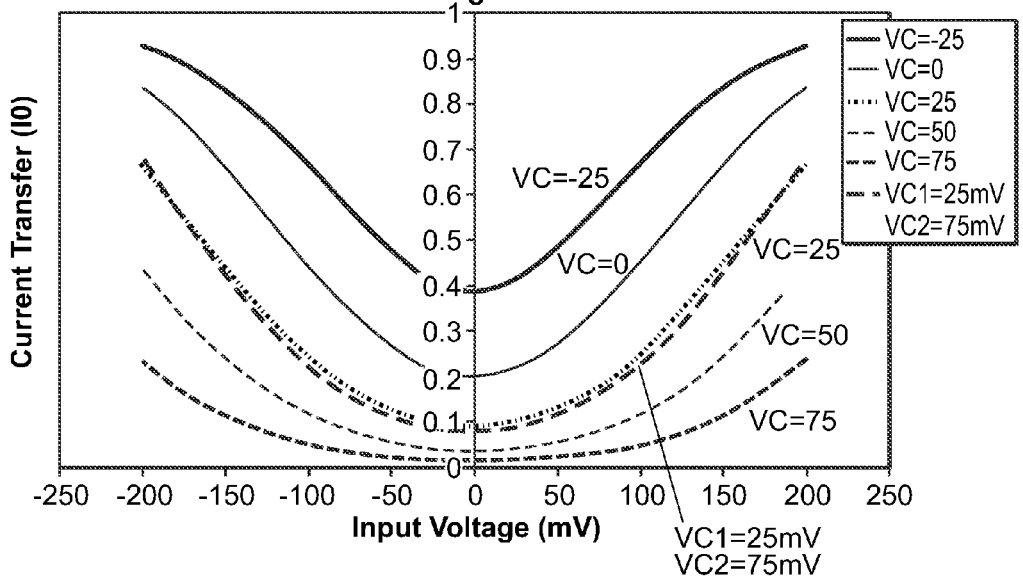
FIG. 13 graphically illustrates the output characteristics of the squaring detector cell of FIG. 12A.
Figure 13:
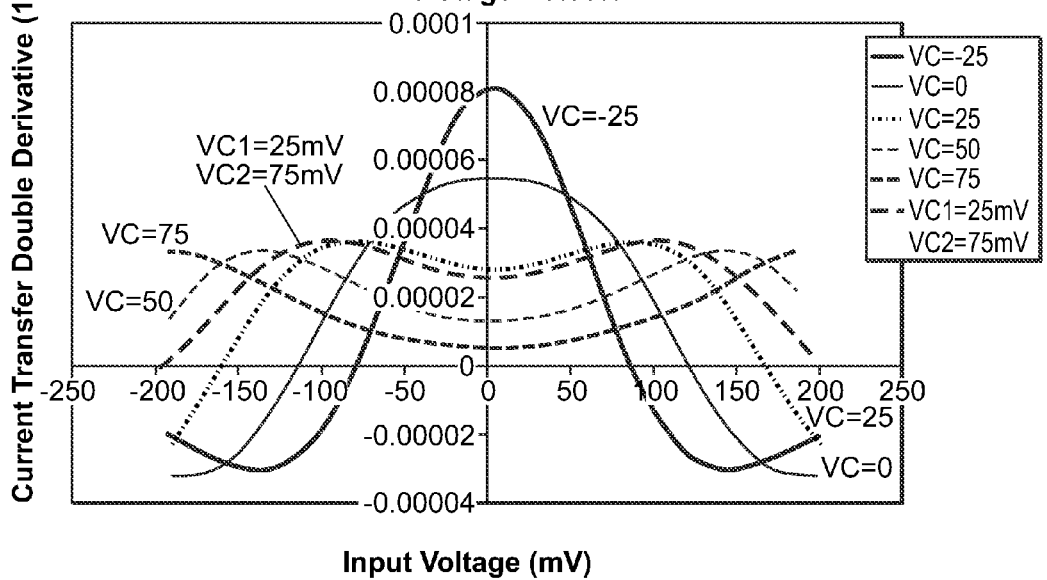

With the use of different offset voltages VC1 and VC2 at the base of center transistors, one of the triple-tail cells can provide approximate square law characteristics for low level input signals, while the second of the triple-tail cells can provide approximate square law characteristics for higher level input signals. When individual outputs of these triple-tail cells (Q1-Q2 for the first cell, Q4-Q5 for the second cell)

are combined (coupled), the overall output may provide approximate square law characteristics for a wider range of input signal levels than possible with the use of a single triple-tail cell. FIG. 13 compares the output characteristics of a two-stage detector cell (D=8, VC1=25 mV, VC2=75 mV) (shown in a dashed line) according to one or more embodiments of the present invention with prior art single-stage detector cells having different VC values (D=8). The graph shows a current detector using two bipolar triple-tail cells having a wider input dynamic range, for providing approximate square law characteristics, compared to a single triple-tail cell.

Figure 12B:
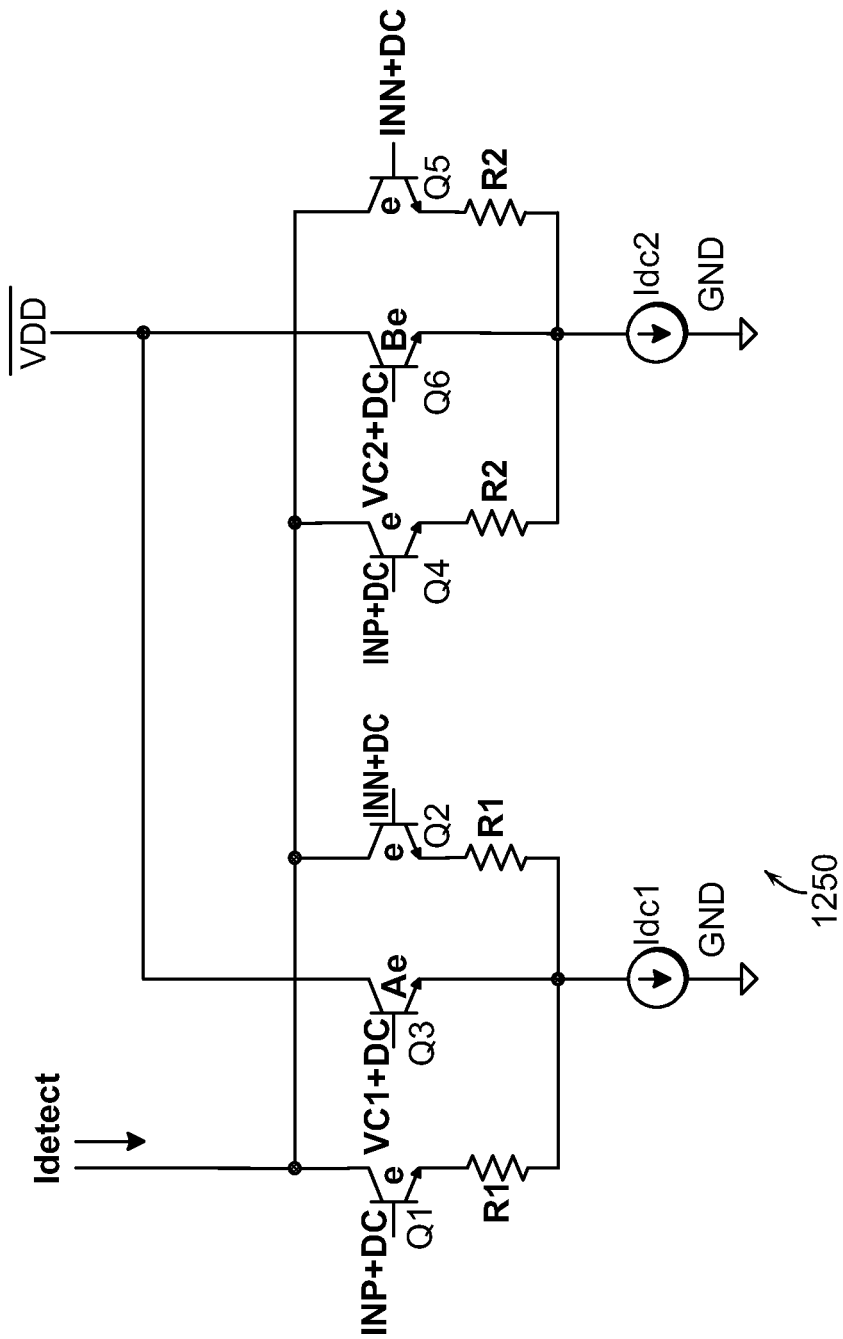
FIG. 12B illustrates a squaring detector cell in accordance with one or more further embodiments.

FIG. 12B illustrates a detector cell 1250 in accordance with one or more further embodiments of the invention. According to this embodiment, emitter degeneration resistors R1 and R2 are added to the structure 1200 shown in FIG. 12A to expand the operating input voltage range of the triple-tail cells. The emitter degeneration resistors R1 and R2 act to smooth the output characteristics of the triple-tail cells reducing the deviations from square law response. Combining the outputs of these triple-tail cells results in a further increase in the dynamic range of input signal levels for which the detector provides approximate square law characteristics.

The differential transistors of each triple-tail cell can have a different area than the differential transistors of the other triple-tail cell. In other words, Q1 and Q2 need not have the same size as Q4 and Q5. The ratio Q3/Q1 should be equal to the ratio Q3/Q2, and the ratio Q6/Q4 should be equal to the ratio Q6/Q5.

Figure 14:
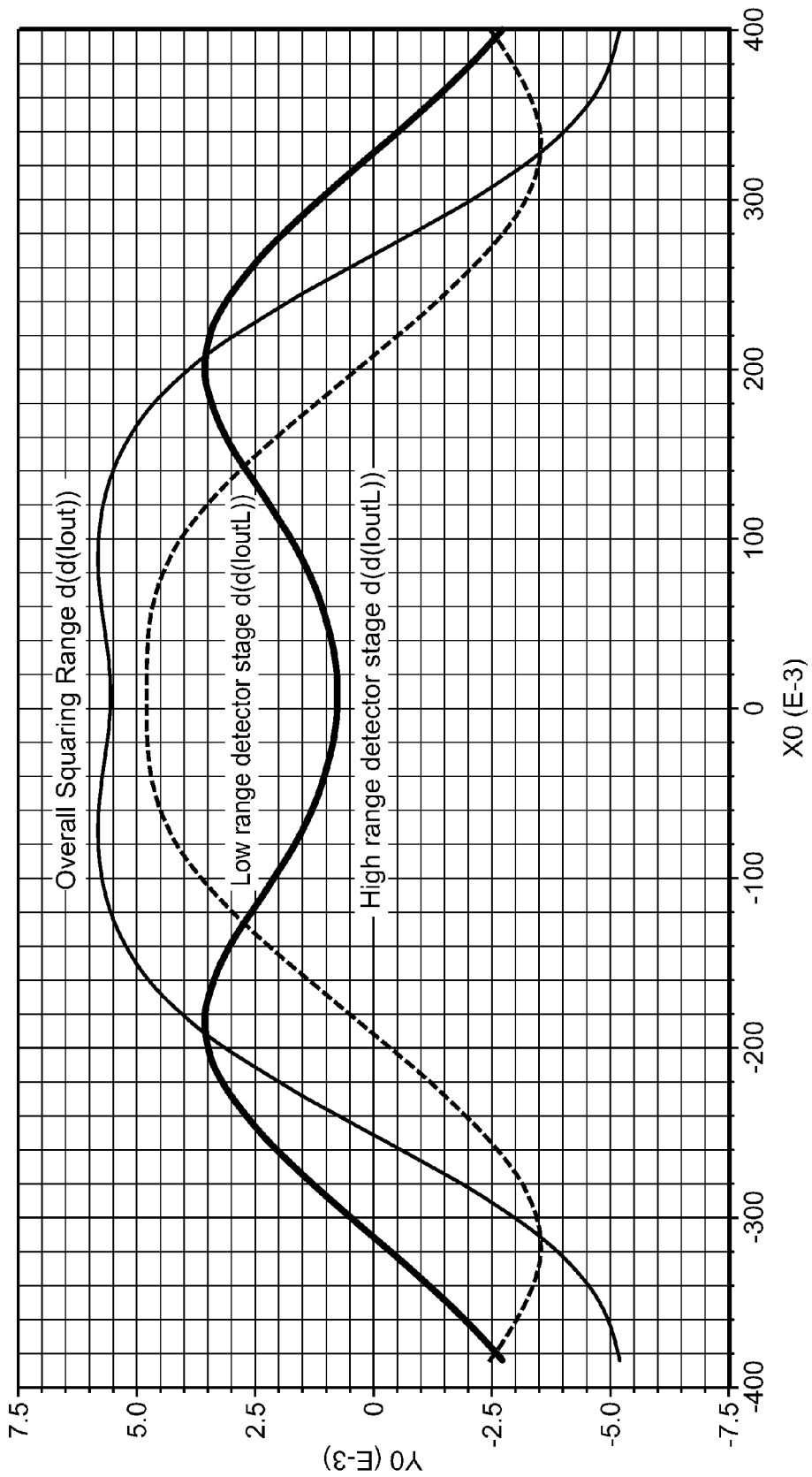
FIG. 14 graphically illustrates the output characteristics of the squaring detector cell of FIG. 12B.

The double derivative of the outputs of the degenerated triple-tail cells (high range and low range), and that of the combined output is shown in FIG. 14. Since a flat level of the double derivative shows square law characteristics, this plot shows that the low range triple-tail cell dominates the output for lower signal levels while the high range detector stage helps to improve the dynamic range for higher signal levels. When compared to the output characteristics of the non-degenerated multiple triple-tail cell of FIG. 12A, the use of multiple degenerated triple-tail cells further improves square law characteristics, resulting in an even wider dynamic range.

Figure 15:
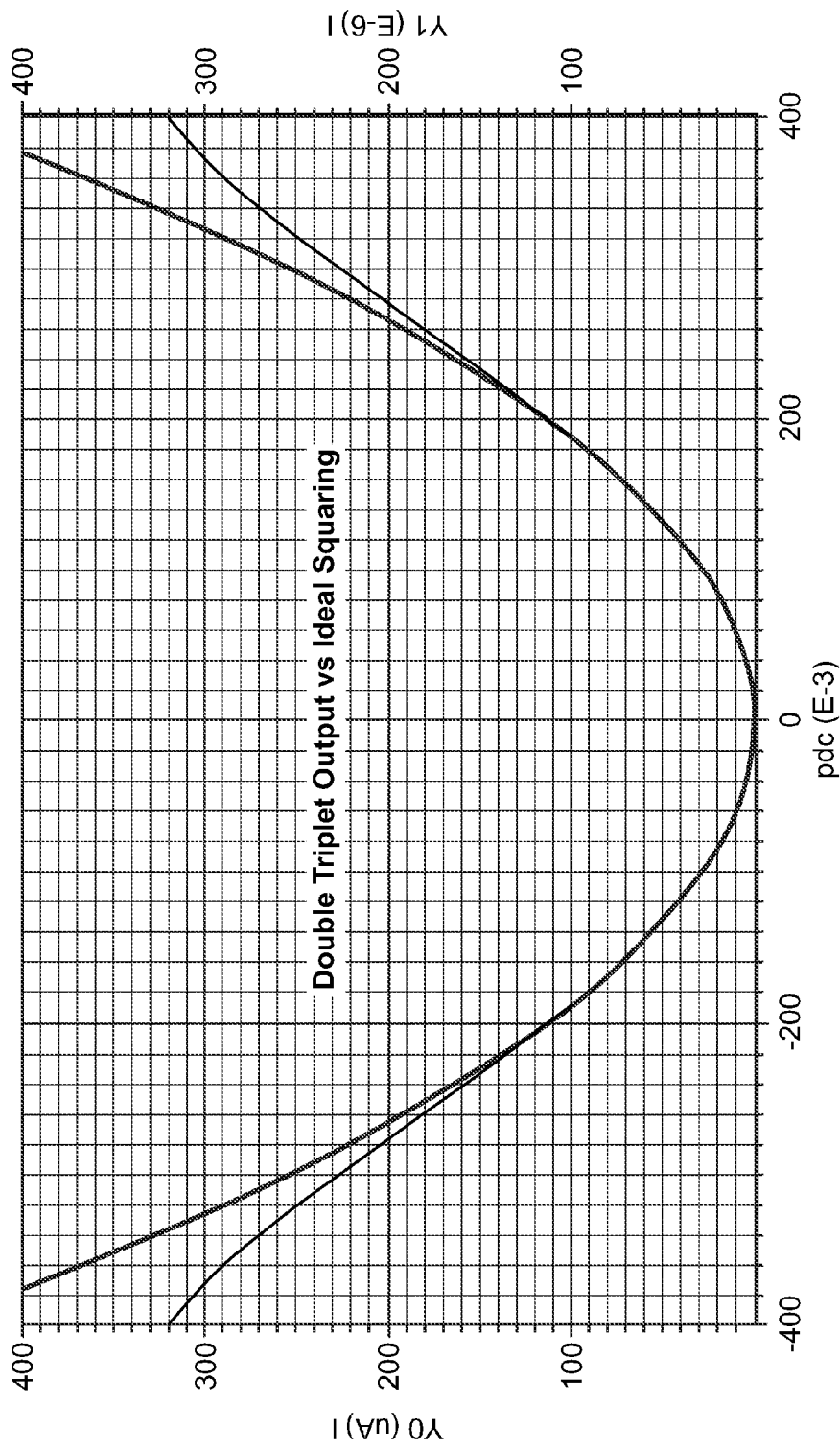
FIG. 15 graphically compares the squaring characteristics of the squaring detector cell in FIG. 12B with the characteristics of the prior art detector cell in FIG. 9A.
Figure 15:
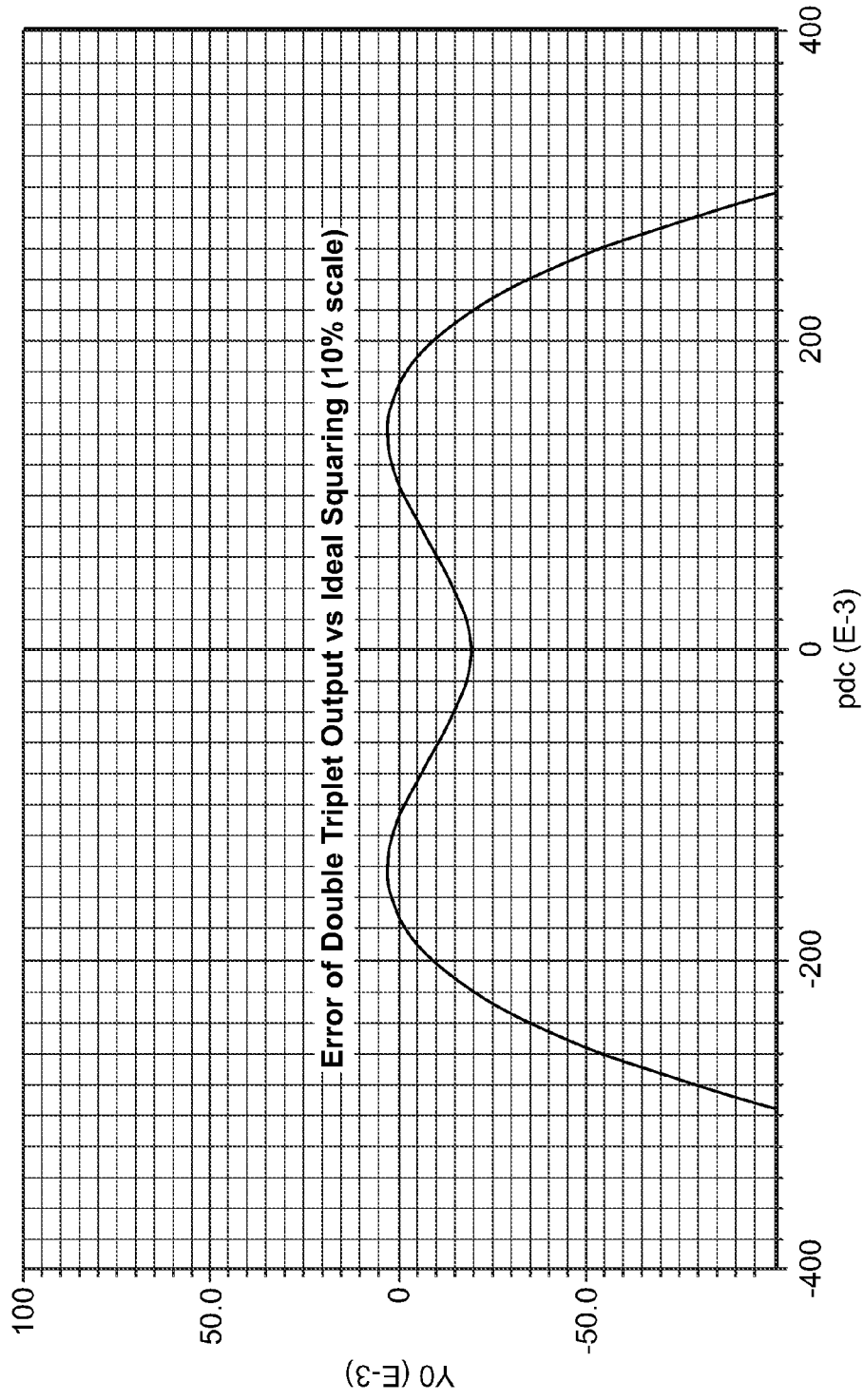
Figure 15:
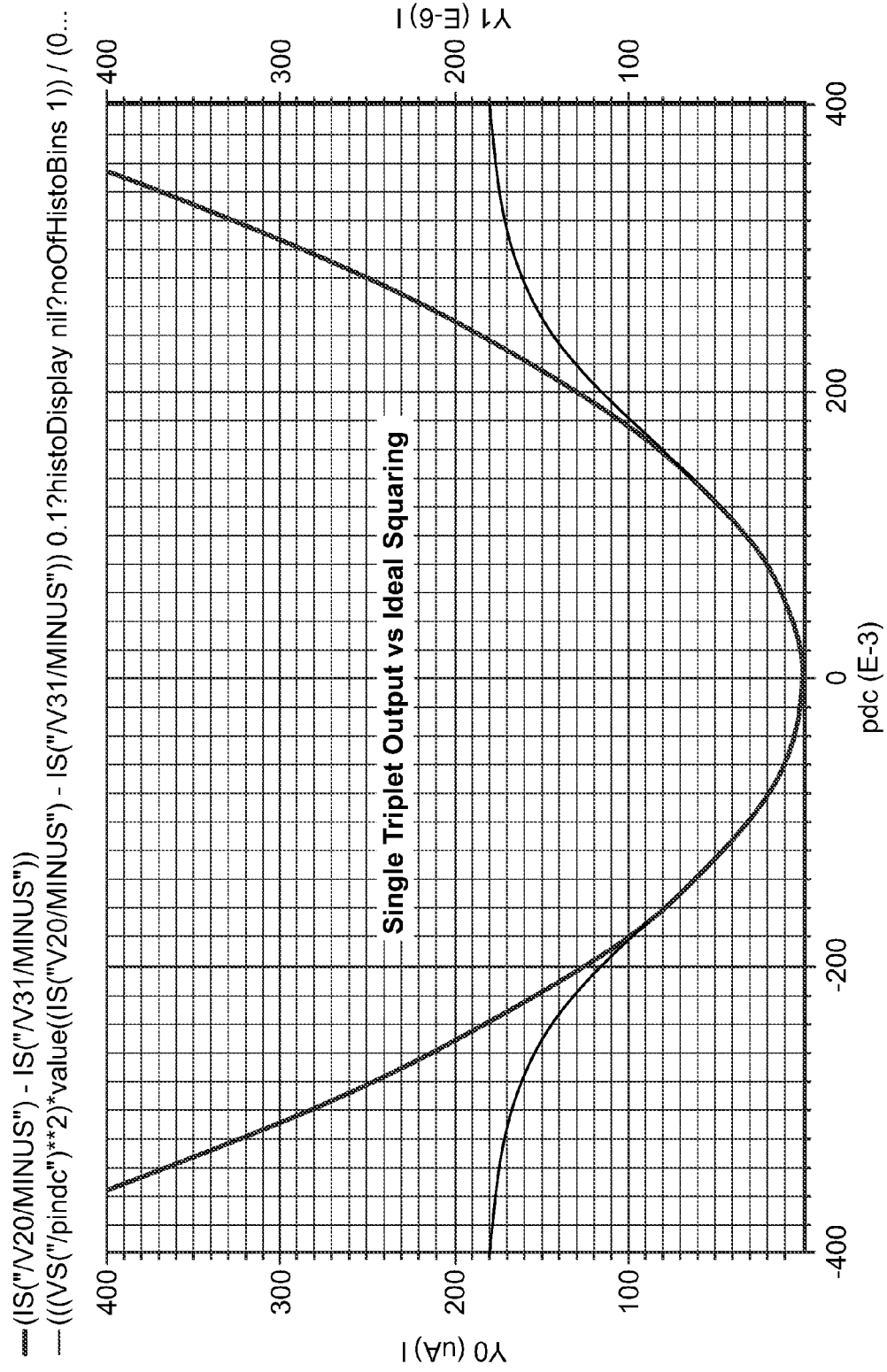
Figure 15:
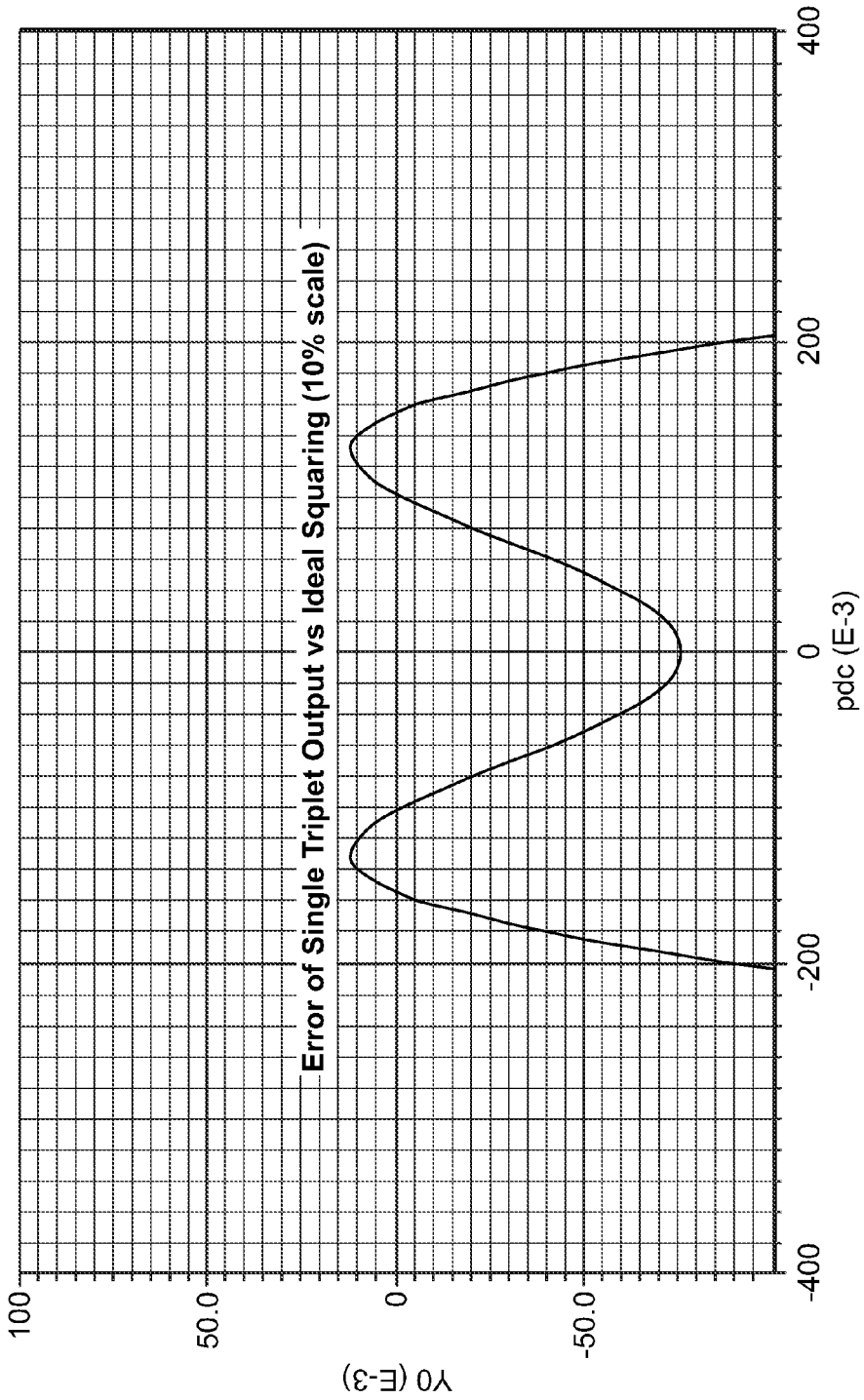

FIG. 15 compares the squaring characteristics of the two stage detector cell in FIG. 12B (degenerated triple-tail cells according to one or more embodiments) with the characteristics of the prior art detector cell in FIG. 9A. The graphs on the left compare the detector output characteristics with ideal square law characteristics, while the graphs on the right provide the percentage error in square law characteristics. As shown, with the use of two stages of degenerated triple-tail cells, the dynamic range may be increased 50% with more accurate square law characteristics possible for all levels of input signals.

Figure 12C:
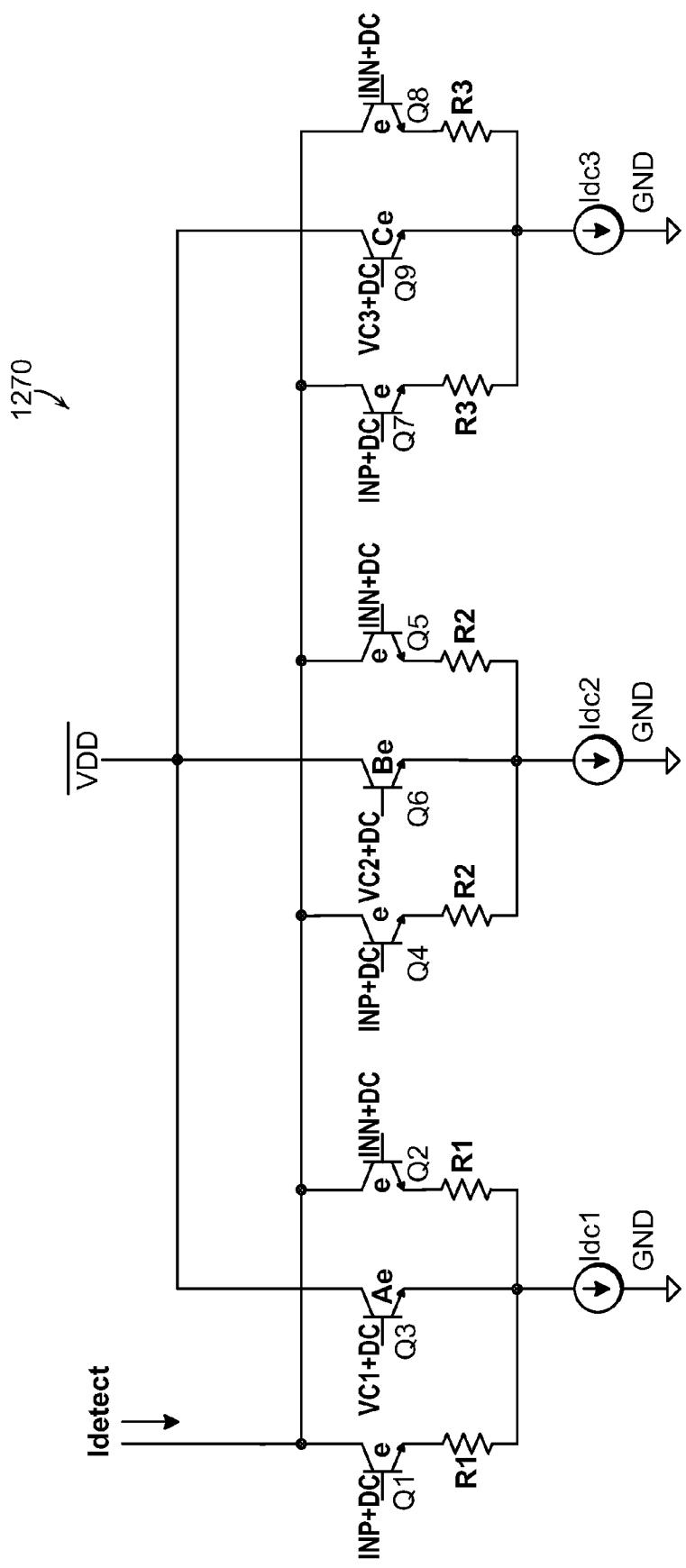
FIG. 12C illustrates a squaring detector cell in accordance with one or more further embodiments.

FIG. 12C illustrates a detector cell 1270 in accordance with one or more further embodiments of the present invention. The detector cell 1270 includes more than two degenerated triple-tail cells connected in parallel with each receiving a differential input voltage of Vinp=INP−INN between the bases of its differential pair transistors (Q1−Q2, Q4−Q5, and Q7−Q8) with a DC voltage component denoted as "DC". The base of the center transistors in each triple-tail cell, Q3, Q6, Q9, etc. however, receives additional offset components VC1, VC2, VC3, etc., respectively, resulting in bias voltage values of DC+VC1, DC+VC2, DC+VC3, etc., respectively. Center transistors Q3, Q6, Q9, etc. may have same or different emitter areas (Ae, Be, Ce, etc.). The collectors of transistors Q1, Q2, Q4, Q5, Q7, Q8, etc. maybe coupled to generate the output of the detector, while collectors of the center transistors Q3, Q6, Q9, etc. maybe coupled to an AC ground such as supply voltage.

The differential transistors of each triple-tail cell can have a different area than the differential transistors of the other triple-tail cells. Q1 and Q2 do not need to have the same size as Q4 and Q5 or Q7 and Q8. The ratio Q3/Q1 should be equal to the ratio Q3/Q2, the ratio Q6/Q4 should be equal to the ratio Q6/Q5, and the ratio Q9/Q7 should be equal to the ratio Q9/Q8.

When individual outputs of these triple-tail cells (Q1-Q2 for the first cell, Q4-Q5 for the second cell, etc.) are combined (coupled), the overall output may provide approximate square law characteristics for a wider range of input signal levels than possible with the use of a single or double triple-tail cells.

In one or more further embodiments, the center transistors (Q3-Q6 in FIG. 12A and FIG. 12B, Q3-Q6-Q9- . . . in FIG. 12C) may receive a parasitic RF component. Additionally, in one or more further embodiments, one of the transistors in the differential pair of each triple-tail cell Q1−Q2 (Q4−Q5, Q7−Q8) may receive a DC voltage at its base and the other two transistors in the triple-tail cell (one of Q1-Q2 or Q4-Q5 or Q7-Q9 and also Q3 or Q6 or Q9) may receive input signals that effectively generates a differential voltage across base inputs of Q1−Q3 or Q4−Q6 or Q7−Q9 (=Vinp/2−VC) and Q2−Q3 or Q5−Q6 or Q8−Q9 (=−Vinp/2−VC).

In summary, in accordance with one or more embodiments, a squaring detector cell is provided comprising a plurality of triple-tail cells whose outputs are combined. Each of the triple-tail cells includes a center transistor whose base receives a different offset voltage VC than the center transistors of other triple-tail cells such that each triple-tail cell provides approximate square law characteristics for input signals of different levels. The squaring detector thus has a wide input dynamic range.

In some embodiments, at least some of the triple-tail cells of the squaring detector cell utilize degeneration to smooth the characteristics of individual triple-tail cells, thereby further improving the dynamic range of the squaring detector. In some embodiments, degeneration is achieved using degeneration resistors. In alternate embodiments, the MOS transistors may be used in the linear region, effectively acting like a resistor.

In some embodiments, the center transistor of each triple-tail cell of the squaring detector has a different emitter area than the center transistors of other triple-tail cells.

In some embodiments, the differential transistors of each triple-tail cell of the squaring detector (with each differential pair having the same transistor sizes) have a different area than the differential transistors of other triple-tail cells.

In some embodiments, the collectors of the two differential pair transistors of the triple-tail cells of the squaring detector are coupled to generate the output of the multiple-stage squaring cell. The collectors of the center transistors of the triple-tail cells are coupled to an AC ground.

In some embodiments, at least some of the triple-tail cells of the squaring detector utilize degeneration to smooth the characteristics of individual triple-tail cells, thereby further improving the dynamic range of the squaring detector. In some embodiments, degenerated triple tail cells are obtained by using degeneration resistors only at the emitters of differential pair transistors in the triple-tail cells. No degeneration resistor is used at the emitter of the center transistors in the triple-tail cells. In other embodiments, degeneration is utilized at the emitter of the center transistors. In further embodiments, degeneration is utilized at each of the emitters of the center transistor and the differential transistors.

In some embodiments, at least some of the triple-tail cells of the squaring detector utilize degeneration to smooth the characteristics of individual triple-tail cells. The use of degeneration and offset voltages in the triple-tail cells enable the usage of smaller size center transistors for obtaining a wide squaring range.

In some embodiments, the use of multiple triple-tail cells helps to reduce the temperature variation even if Idc1, Idc2, . . . IdcN have the same temperature coefficients. As an alternative Idc1, Idc2, . . . IdcN can be selected to have different temperature coefficients.

It is to be understood that although the invention has been described above in terms of particular embodiments, the foregoing embodiments are provided as illustrative only, and do not limit or define the scope of the invention. Various other embodiments, including but not limited to the following, are also within the scope of the claims. For example, elements and components described herein may be further divided into additional components or joined together to form fewer components for performing the same functions. As one example, the functions of the top limiting element 202 and the integrator 104 can be performed by a single element, so long as the top limiting operation does not occur before the integration operation. As another example, the functions of the top limiting and bottom clipping element 202 and the nonlinear transformation element 502 can be performed by a single element.

What is claimed is:

1. A mean square power detector, comprising:
   a gain or attenuation circuit comprising a plurality of gain or attenuation elements arranged for generating a plurality of amplified or attenuated versions of a radio frequency (RF) input signal;
   a plurality of mean square detectors coupled to the gain or attenuation circuit, each of the mean square detectors receiving a different one of the plurality of amplified or attenuated versions of the RF input signal, each of said plurality of mean square detectors generating an output signal representative of the mean square power of the RF input signal for a different input signal level range; and
   a summing element coupled to the plurality of mean square detectors for combining the output signals of the plurality of mean square detectors to generate a signal representative of the mean square or root mean square of the RF input signal.

2. The mean square power detector of claim 1, wherein the summing element generates a signal that varies as a quasi-linear function of the logarithm of the mean of the square of the RF input signal voltage.

3. The mean square power detector of claim 1, wherein the plurality of gain or attenuation elements are arranged in a series configuration for generating progressively amplified or attenuated versions of the RF input signal.

4. The mean square power detector of claim 1, wherein the plurality of gain or attenuation elements are arranged in a parallel configuration.

5. The mean square power detector of claim 1, further comprising a plurality of top limiting and bottom clipping elements, each coupled between a different one of the plurality of mean square detectors and the summing element, wherein the top limiting and bottom clipping elements are configured to bottom clip the outputs of the mean square detectors to remove an inaccurate detection range resulting from noise or mismatch.

6. The mean square power detector of claim 1, further comprising a plurality of top limiting and bottom clipping elements, each coupled between a different one of the plurality of mean square detectors and the summing element, wherein the top limiting and bottom clipping elements are configured to remove the inaccurate detection range resulting from shifting from squaring characteristics.

7. The mean square power detector of claim 1, further comprising:
   a plurality of top limiting and bottom clipping elements, each coupled to receive the output from a different one of the plurality of mean square detectors; and
   a plurality of nonlinear transformation elements, each coupled between the summing element and a different one of the plurality of top limiting and bottom clipping elements, wherein each nonlinear transformation element generates an output that is approximately logarithmic for mid-range signals with smooth increase and smooth limiting sections for low and high range signals, respectively.

8. The mean square power detector of claim 7, wherein each of the plurality of nonlinear transformation elements performs a different nonlinear function to obtain log-linear characteristics.

9. The mean square power detector of claim 7, wherein operations of some of the plurality of top-limiting and bottom clipping elements maybe different from others or wherein operations of some of the plurality of nonlinear transformation elements maybe different from others for improving the detection dynamic range or for obtaining different transfer characteristics.

10. The mean square power detector of claim 1, further comprising:
    a plurality of nonlinear transformation elements, each coupled to receive the output from a different one of the plurality of mean square detectors, wherein each nonlinear transformation element generates an output that is approximately logarithmic for mid-range signals with smooth increase and smooth limiting sections for low and high range signals, respectively; and
    a plurality of top limiting and bottom clipping elements, each coupled between the summing element and a different one of the plurality of nonlinear transformation elements.

11. The mean square power detector of claim 1, further comprising a plurality of transformation elements, each transformation element coupled between a different one of the plurality of mean square detectors and the summing element, wherein the transformation elements are configured to remove an inaccurate detection range resulting from shifting from squaring characteristics and to generate an output that is approximately logarithmic for mid-range signals with smooth increase and smooth limiting sections for low and high range signals, respectively.

12. The mean square power detector of claim 1, further comprising one or more zeroing bias elements for removing the output signals of mean square detectors at zero input signal levels.

13. The mean square power detector of claim 1, wherein each of the mean square detectors comprises a squaring detector and an integrator for averaging an output of the squaring detector.

14. The mean square power detector of claim 13, further comprising a plurality of capacitance multipliers that are controllable by a user, each of the capacitance multipliers being coupled to an output of a different one of the integrators for obtaining different integration time constants.

15. The mean square power detector of claim 1, wherein the gain or attenuation circuit further comprises a DC offset cancellation feedback loop to avoid saturation of high-end gain elements in the circuit due to DC offsets.

16. The mean square power detector of claim 1, wherein each of the mean square detectors comprises a squaring detector cell, said squaring detector cell comprising a plurality of triple-tail cells having their respective outputs combined together to generate an output of the squaring detector cell, each of the triple-tail cells comprising a plurality of transistors including a center transistor whose base receives a different offset voltage VC than the center transistor of one or more other triple-tail cells in the squaring detector cell such that each triple-tail cell provides approximate square law characteristics for input signals of different levels.

17. The mean square power detector of claim 1, wherein the gain or attenuation circuit comprises a plurality of gain and attenuation elements arranged for generating a plurality of amplified and attenuated versions of a radio frequency (RF) input signal.

18. A method for detecting the power of a radio frequency (RF) input signal, comprising the steps of:
(a) generating a plurality of amplified or attenuated versions of the RF input signal;
(b) for each of the plurality of amplified or attenuated versions of the RF input signal, generating a signal representative of the mean square power of the RF input signal for a different input signal level range; and
(c) combining the signals generated at step (b) to generate a signal representative of the mean square or root mean square of the RF input signal.

19. The method of claim 18, wherein step (a) comprises generating a plurality of progressively amplified or attenuated versions of an RF input signal.

20. The method of claim 18, wherein the mean square power generated at step (c) varies as a quasi-linear function of the logarithm of the mean of the square of the RF input signal voltage.

21. The method of claim 18, further comprising bottom clipping the signals generated at step (b) to remove an inaccurate detection range resulting from noise or mismatch prior to step (c).

22. The method of claim 18, further comprising top limiting the signals generated at step (b) to remove the inaccurate detection range resulting from shifting from squaring characteristics prior to step (c).

23. The method of claim 18, further comprising:
top limiting or bottom clipping the signals generated at step (b); and
generating an output that is approximately logarithmic for mid-range signals with smooth increase and smooth limiting sections for low and high range signals.

24. The method of claim 23, wherein the step of top limiting or bottom clipping the signals comprises performing different top limiting or bottom clipping operations on the signals generated at step (b) for improving the detection dynamic range or for obtaining different transfer characteristics.

25. The method of claim 18, further comprising removing the signals generated at step (b) at zero input signal levels.

26. The method of claim 18, wherein step (b) is performed using a squaring detector and an integrator for averaging an output of the squaring detector.

27. The method of claim 26, further comprising obtaining integration time constants using integrated capacitors for the averaged signals, wherein the integration time constants are controllable by a user.

28. The method of claim 18, further comprising canceling a DC offset in step (a) to avoid saturation of high-end gain elements due to DC offsets.

29. The method of claim 18, wherein step (a) comprises generating a plurality of amplified and attenuated versions of the RF input signal.

30. A squaring detector cell, comprising a plurality of triple-tail cells having their respective outputs combined together to generate an output of the squaring detector cell, each of the triple-tail cells comprising a plurality of transistors including a center transistor whose base receives a different offset voltage VC than the center transistor of one or more other triple-tail cells in the squaring detector cell such that each triple-tail cell provides approximate square law characteristics for input signals of different levels.

31. The squaring detector cell of claim 30, wherein at least one of the plurality of triple-tail cells of the squaring detector cell utilizes degeneration to smooth the characteristics of the at least one triple-tail cell for improving the dynamic range of the squaring detector.

32. The squaring detector cell of claim 31, wherein the degeneration is performed by a degeneration resistor or a MOS transistor used in a linear region.

33. The squaring detector cell of claim 31, wherein each triple-tail cell includes a pair of differential transistors and a center transistor, and wherein the degeneration is performed by a degeneration resistor provided at the emitters of the differential pair of transistors.

34. The squaring detector cell of claim 33, wherein no degeneration resistor is used at the emitter of the center transistors in the triple-tail cells.

35. The squaring detector cell of claim 31, wherein each triple-tail cell includes a pair of differential transistors and a center transistor, and wherein the degeneration is performed by a degeneration resistor provided at the emitter of the center transistor.

36. The squaring detector cell of claim 31, wherein each triple-tail cell includes a pair of differential transistors and a center transistor, and wherein the degeneration is performed by a degeneration resistor provided at the emitter of the center transistor and at the emitters of the differential transistors.

37. The squaring detector cell of claim 30, wherein the center transistors of some of the triple-tail cells of the squaring detector have a different emitter area than the center transistor of one or more other triple-tail cells of the squaring detector.

38. The squaring detector cell of claim 30, wherein each triple-tail cell includes a pair of differential transistors of the same size, and the differential transistor pairs of each triple-tail cell have a different area than the differential transistor pairs of one or more other triple-tail cells of the squaring detector cell.

39. The squaring detector cell of claim 30, wherein each triple-tail cell includes a pair of differential transistors, and wherein the collectors of each of the differential transistors of the triple-tail cells of the squaring detector are coupled to generate the output of squaring detector cell, and wherein the collectors of the center transistors of the triple-tail cells are coupled to an AC ground.

40. The squaring detector cell of claim 30, wherein at least one of the triple-tail cells of the squaring detector utilizes degeneration to smooth the characteristics of the triple-tail cell, wherein the use of degeneration and offset voltages in the triple-tail cells enable the usage of smaller size center transistors for obtaining a wide squaring range.

41. The squaring detector cell of claim 30, wherein each triple-tail cell includes a current source coupled to their common emitters generating a tail current Idc, and wherein the tail currents of the triple-tail cells have the same temperature coefficient for temperature compensation.

42. The squaring detector cell of claim 30, wherein each triple-tail cell includes a current source coupled to their common emitters generating a tail current Idc, and wherein the tail currents of the triple-tail cells have different temperature coefficients for temperature compensation.

* * * * *